United States Patent
Yasunami et al.

(10) Patent No.: US 6,887,647 B2
(45) Date of Patent: May 3, 2005

(54) NEGATIVE-WORKING RESIST COMPOSITION FOR ELECTRON BEAMS OR X-RAYS

(75) Inventors: Shoichiro Yasunami, Shizuoka (JP); Koji Shirakawa, Shizuoka (JP); Yutaka Adegawa, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 288 days.

(21) Appl. No.: 10/101,178

(22) Filed: Mar. 20, 2002

(65) Prior Publication Data

US 2002/0192592 A1 Dec. 19, 2002

(30) Foreign Application Priority Data

Mar. 21, 2001 (JP) .................................... P. 2001-080858

(51) Int. Cl.$^7$ .............................................. G03F 7/004
(52) U.S. Cl. ..................... 430/270.1; 430/296; 430/914
(58) Field of Search ............................. 430/270.1, 296, 430/914

(56) References Cited

U.S. PATENT DOCUMENTS

| | | | |
|---|---|---|---|
| 5,595,855 A | | 1/1997 | Padmanaban et al. |
| 6,136,500 A | * | 10/2000 | Kobayashi et al. ...... 430/270.1 |
| 6,291,129 B1 | * | 9/2001 | Shida et al. ............. 430/270.1 |

FOREIGN PATENT DOCUMENTS

| | | | |
|---|---|---|---|
| EP | 1076261 A1 * | 2/2001 | ........... G03F/7/004 |
| JP | 9-43837 | 2/1997 | |
| JP | 11-125907 | 5/1999 | |

* cited by examiner

*Primary Examiner*—Amanda Walke
(74) *Attorney, Agent, or Firm*—Sughrue Mion, PLLC

(57) ABSTRACT

A negative-working resist composition for electron beams or X-rays comprising (A) a compound generating a sulfonic acid by the irradiation of electron beams or x-rays, (B) a resin which is insoluble in water and soluble in an alkali aqueous solution, (C) a crosslinking agent crosslinking with the resin (B) by the action of an acid, and (D) a compound generating a carboxylic acid having a specific structure by the irradiation of electron beams or x-rays.

7 Claims, No Drawings

NEGATIVE-WORKING RESIST COMPOSITION FOR ELECTRON BEAMS OR X-RAYS

FIELD OF THE INVENTION

The present invention relates to a negative-working resist composition suitably used for super-micro lithographic processes, e.g., the productions of VLSI and high-capacity microchips, and other photofabrication processes. More specifically, the invention relates to a negative-working photoresist composition capable of forming high precision patterns using, e.g., electron beams or X-rays, and particularly to a negative-working resist composition which can be suitably used for fine processing of semiconductor devices using high energy rays e.g., electron beams.

BACKGROUND OF THE INVENTION

In integrated circuits, the degree of integration is more and more increased and in the production of a semiconductor substrate of VLSI, processing of super-fine patterns made of line width having a half-micron or less has been required. For satisfying the requirement, the wavelength of a light exposure apparatus used for a photolithography is more and more shortened and at present, the use of a far ultraviolet light and an excimer laser (e.g., XeCl, KrF or ArF) has been investigated. Furthermore, the formation of finer patterns by electron beams or X-rays has been investigated.

Particularly, electron beam lithography is positioned in the next generation or the next but one generation pattern-forming technique, and developments of negative-working resist having high sensitivity and high resolution and excellent in reproducibility of beam shape have been eagerly desired. The reproducibility of beam shape is an important property for forming a desired pattern in variable-shaped direct imaging electron beam lithography. In especial, when crooked line patterns are imaged, it is important that the beam shapes can be reproduced at the crooked parts in the patterns formed, from the viewpoint of the post-step (super-fine processing of substrate).

As a resist material for such a purpose, a chemical amplification type resist mainly utilizing an acid catalyst reaction is used and as a negative-working resist, a chemical amplification resist composition containing as the main components, an alkali-soluble resin, an acid generator and an acid crosslinking agent is effectively used.

Regarding the acid generator, Japanese Patent Publication No. 3635/1996 discloses organic halogen compounds, Japanese Patent Laid-Open No. 52348/1990 discloses aromatic compounds substituted with Br or Cl, Japanese Patent Laid-Open No. 367864/1992 and Japanese Patent Laid-Open No. 367865/1992 disclose aromatic compounds having an alkyl or alkoxy group substituted with Br or Cl, Japanese Patent Laid-Open No. 150848/1990 and Japanese Patent Laid-Open No. 199770/1994 discloses iodonium compounds and sulfonium compounds, Japanese Patent Laid-Open No. 87746/1991 discloses haloalkane sulfonate compounds, Japanese Patent Laid-Open No. 210960/1992 and Japanese Patent Laid-Open No. 217249/1992 disclose diazodisulfone compounds or diazosulfone compounds, Japanese Patent Laid-Open No. 336454/1992 discloses Br- or I-substituted alkyltriazine compounds, Japanese Patent Laid-Open No. 291258/1992 discloses sulfonamide compounds and sulfonimide compounds, Japanese Patent Laid-Open No. 291259/1992 discloses sulfonic acid compounds of polyhydric phenols, Japanese Patent Laid-Open No. 291260/1992, Japanese Patent Laid-Open No. 291261/1992, and Japanese Patent Laid-Open No. 202320/1994 disclose naphthoquinonediazido-4-sulfonate compounds, Japanese Patent Laid-Open No. 210239/1993 discloses disulfone compounds, Japanese Patent Laid-Open No. 236024/1994 discloses N-oxyimidosulfonate compounds, and U.S. Pat. No. 5,344,742 discloses benzylsulfonate compounds.

Regarding the acid crosslinking agent, Japanese Patent Laid-Open No. 75652/1991, Japanese Patent Laid-Open No. 181277/1993 and Japanese Patent Laid-Open No. 146556/1995 disclose methoxymethylmelamine compounds, Japanese Patent Laid-Open No. 281455/1992, Japanese Patent Laid-Open No. 232702/1993 and Japanese Patent Laid-Open No. 83055/1994 disclose compounds having an alkoxymethyl ether group, Japanese Patent Laid-Open No. 281715/1993 discloses oxazine compounds, Japanese Patent Laid-Open No. 134412/1993 and Japanese Patent Laid-Open No. 3825/1994 disclose aromatic compounds having an alkoxyalkyl group, Japanese Patent Laid-Open No. 194838/1994 discloses trioxane compounds, and Japanese Patent Laid-Open No. 293339/1989 discloses alkoxymethyluryl compounds.

Moreover, Japanese Patent Laid-Open No. 43837/1997 discloses combinations of hydroxystyrene copolymer resins and basic compounds decomposable into neutral compounds by radiation, and Japanese Patent Laid-Open No. 125907/1999 discloses combinations of hydroxystyrene resins and compounds generating carboxylic acids having a high boiling point by radiation.

However, any combination of these compounds cannot satisfy a high sensitivity, a high resolution, and reproducibility of beam shape all together.

SUMMARY OF THE INVENTION

Accordingly, an object of the present invention is to solve problems in the techniques for improving the performance in fine processing of semiconductor device using electron beams or X-rays.

Another object of the present invention is to provide a negative-working chemical amplification resist composition for electron beams or X-rays satisfying the properties of sensitivity, resolution and reproducibility of beam shape all together.

As the result of extensive investigations, the present inventors have found that the above objects of the invention can be attained by adding a compound generating a specific carboxylic acid by irradiation of electron beams or X-rays to a chemical amplification negative-working resist composition containing a compound generating a sulfonic acid by the irradiation of electron beams or x-rays, a resin which is insoluble in water but soluble in an alkali aqueous solution and a crosslinking agent, and completed the present invention.

Specifically, the present invention includes the following negative-working resist compositions:

(1) A negative-working resist composition for electron beams or X-rays comprising (A) a compound generating a sulfonic acid by the irradiation of electron beams or x-rays, (B) a resin which is insoluble in water and soluble in an alkali aqueous solution, (C) a crosslinking agent crosslinking with the resin (B) by the action of an acid, and (D) a compound generating, by the irradiation of electron beams or x-rays, a carboxylic acid represented by the following formula (a):

$$R_a\text{—COOH} \qquad (a)$$

wherein $R_a$ represents an alkyl group having 1 to 4 carbon atoms or a perfluoroalkyl group having 1 to 8 carbon atoms.

(2) The negative-working resist composition for electron beams or X-rays according to above (1), wherein the resist composition further comprises (E) a nitrogen-containing organic basic compound.

(3) The negative-working resist composition for electron beams or X-rays according to above (1) or (2), wherein the resin (B) is a resin having a repeating unit represented by the following formula (b):

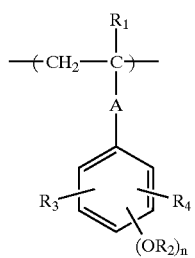

(b)

wherein $R_1$ represents a hydrogen atom, a halogen atom, a cyano group, or an alkyl or haloalkyl group which may have a substituent; $R_2$ represents a hydrogen atom, or an alkyl, cycloalkyl, aryl, aralkyl or acyl group which may have a substituent; $R_3$ and $R_4$, which may be the same or different, each represents a hydrogen atom, a halogen atom, a cyano group, or an alkyl, cycloalkyl, alkenyl, aralkyl or aryl group which may have a substituent; A represents a single bond, an alkylene, alkenylene, cycloalkylene or arylene group which may have a substituent, —O—, —SO$_2$—, —O—CO—R$_5$—, —CO—O—R$_6$—, or —CO—N(R$_7$)—R$_8$—; $R_5$, $R_6$ and $R_8$, which may be the same or different, each represents a single bond, an alkylene, alkenylene, cycloalkylene or arylene group, which may have a substituent, or a divalent group formed by combining the above-described alkylene, alkenylene, cycloalkylene or arylene group and at least one member selected from an ether structure, an ester structure, an amido structure, a urethane structure and a ureido structure; $R_7$ represents a hydrogen atom, or an alkyl, cycloalkyl, aralkyl or aryl group which may have a substituent; and n represents an integer of 1 to 3; or plural $R_2$'s, or $R_2$ and $R_3$ or $R_4$ may combine with each other to form a ring.

(4) The negative-working resist composition for electron beams or X-rays according to above (1) or (2), wherein the resin (B) is a resin having at least one repeating unit selected from those represented by the following formulae (b-2) and (b-3):

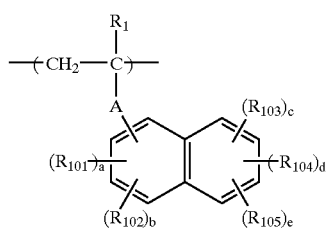

(b-2)

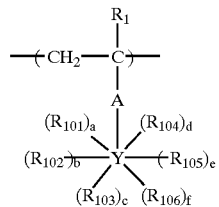

(b-3)

wherein $R_1$ and A have the same meanings as $R_1$ and A in formula (b), respectively; $R_{101}$ to $R_{106}$ each independently represents a hydroxyl group, a linear, branched or cyclic alkyl group, an alkoxy group, an alkylcarbonyloxy group, an alkylsulfonyloxy group, an alkenyl group, an aryl group, an aralkyl group, a carboxyl group, an amino group, an N-alkylamino group, or an N-dialkylamino group; a to f each independently represents an integer of 0 to 3; and Y represents a condensed polycyclic aromatic structure selected from those shown below.

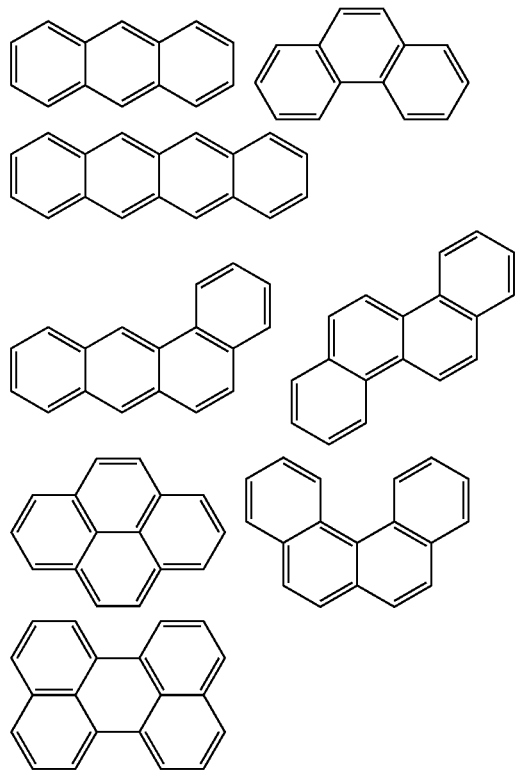

DETAILED DESCRIPTION OF THE INVENTION

The compounds used in the invention are described in detail below.

(1) Alkali-soluble Resin (B) Used in the Invention:

The alkali-soluble resin for use in the invention includes polymers having a phenol skeleton, for example, phenol novolak resins, polyvinylphenol resins, copolymers having a structural unit originated in vinylphenol, and resins obtained by protecting or modifying a part of polyvinylphenol resin, which have hitherto been disclosed for negative-working chemical amplification type resists. Preferably, a phenol resin containing a repeating structural unit represented by the above-described formula (b) is exemplified.

In formula (b), $R_1$ represents a hydrogen atom, a halogen atom, a cyano group, or an alkyl or haloalkyl group which may have a substituent. $R_2$ represents a hydrogen atom, or an alkyl, cycloalkyl, aryl, aralkyl or acyl group which may have a substituent. $R_3$ and $R_4$, which may be the same or different, each represents a hydrogen atom, a halogen atom, a cyano group, or an alkyl, cycloalkyl, alkenyl, aralkyl or aryl group which may have a substituent.

A represents a single bond, an alkylene, alkenylene, cycloalkylene or arylene group which may have a substituent, —O—, —SO$_2$—, —O—CO—R$_5$—, —CO—O—R$_6$— or —CO—N (R$_7$)—R$_8$—.

$R_5$, $R_6$ and $R_8$, which may be the same or different, each represents a single bond, an alkylene, alkenylene, cycloalkylene or arylene group which may have a substituent or a divalent group formed by combining the above-described alkylene, alkenylene, cycloalkylene or arylene group and at least one member selected from an ether structure, an ester structure, an amido structure, a urethane structure and a ureido structure.

$R_7$ represents a hydrogen atom, or an alkyl, cycloalkyl, aralkyl or aryl group which may have a substituent.

n represents an integer of 1 to 3. Also, plural $R_2$'s, or $R_2$ and $R_3$ or $R_4$ may combine with each other to form a ring.

The alkyl group for $R_1$ to $R_4$ and $R_7$ preferably includes an alkyl group having 1 to 8 carbon atoms, specifically, methyl, ethyl, propyl, n-butyl, sec-butyl, hexyl, 2-ethylhexyl and octyl groups. The cycloalkyl group for $R_2$ to $R_4$ and $R_7$ may be monocyclic or polycyclic. The monocyclic cycloalkyl group includes preferably those having 3 to 8 carbon atoms, specifically, cyclopropyl, cyclopentyl and cyclohexyl groups. The polycyclic cycloalkyl group preferably includes adamantyl, norbornyl, isobornyl, dicyclopentyl, α-pinenyl and tricyclodecanyl groups.

The alkenyl group for $R_3$ and $R_4$ preferably includes an alkenyl group having 2 to 8 carbon atoms, specifically, vinyl, allyl, butenyl and cyclohexenyl groups.

The aryl group for $R_2$ to $R_4$ and $R_7$ preferably includes an aryl group having 6 to 15 carbon atoms, specifically, phenyl, tolyl, dimethylphenyl, 2, 4, 6-trimethylphenyl, naphthyl and anthryl groups.

The aralkyl group for $R_2$ to $R_4$ and $R_7$ preferably includes an aralkyl group having 7 to 12 carbon atoms, specifically, benzyl, phenethyl and naphthylmethyl groups.

The haloalkyl group for $R_1$ preferably includes a haloalkyl group having 1 to 4 carbon atoms, specifically, chloromethyl, chloroethyl, chloropropyl, chlorobutyl, bromomethyl and bromoethyl groups.

The acyl group for $R_2$ preferably includes an acyl group having 1 to 8 carbon atoms, specifically, formyl, acetyl, propanoyl, butanoyl, pivaloyl and benzoyl groups.

The alkylene group for A, $R_5$, $R_6$ and $R_8$ preferably includes an alkylene group having 1 to 8 carbon atoms, e.g., methylene, ethylene, propylene, butylene, hexylene and octylene groups, which may have a substituent.

The alkenylene group for A, $R_5$, $R_6$ and $R_8$ preferably includes an alkenylene group having 2 to 6 carbon atoms, e.g., ethenylene, propenylene and butenylene groups, which may have a substituent.

The cycloalkylene group for A, $R_5$, $R_6$ and $R_8$ preferably includes a cycloalkylene group having 5 to 8 carbon atoms, e.g., cyclopentylene and cyclohexylene groups, which may have a substituent.

The arylene group for A, $R_5$, $R_6$ and $R_8$ preferably includes an arylene group having 6 to 12 carbon atoms, e.g., phenylene, tolylene and naphthylene groups.

The substituent for the above-described groups includes a group having an active hydrogen, for example, an amino group, an amido group, a ureido group, a urethane group, a hydroxyl group or a carboxyl group; a halogen atom (e.g., fluorine, chlorine, bromine or iodine atom), an alkoxy group (e.g., methoxy, ethoxy, propoxy or butoxy group), a thioether group, an acyl group (e.g., acetyl, propanoyl or benzoyl group), an acyloxy group (e.g., acetoxy, propanoyloxy or benzoyloxy group), an alkoxycarbonyl group (e.g., methoxycarbonyl, ethoxycarbonyl or propoxycarbonyl group), a cyano group and a nitro group. Particularly, a group having an active hydrogen, for example, an amino group, a hydroxyl group or a carboxyl group is preferred.

The ring formed by combining plural $R_2$'s, or $R_2$ and $R_3$ or $R_4$ with each other includes 4- to 7-membered rings containing an oxygen atom, for example, benzofuran, benzodioxonol or benzopyran ring.

The resin (B) for use in the invention may be a resin composed of the repeating structural unit represented by formula (b) alone. For the purpose of further improving performance of the negative-working resist composition of the invention, the resin may be a copolymer with one or more other polymerizable monomers.

The copolymerizable monomers which can be used in the invention include, for example, compounds having one addition polymerizable unsaturated bond selected from acrylic acid esters, acrylamides, methacrylic acid esters, methacrylamides, allyl compounds, vinyl ethers, vinyl esters, styrenes and crotonic acid esters, other than the above-described monomers.

Specific examples of the acrylic acid esters include alkyl (number of carbon atoms in the alkyl group is preferably from 1 to 10) acrylates (e.g., methyl acrylate, ethyl acrylate, propyl acrylate, tert-butyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethyl-3-hydroxypropyl acrylate, 5-hydroxypentyl acrylate, trimethylolpropane monoacrylate, pentaerythritol monoacrylate, glycidyl acrylate, benzyl acrylate, furfuryl acrylate and tetrahydrofurfuryl acrylate) and aryl acrylates (e.g., phenyl acrylate).

Specific examples of the methacrylic acid esters include alkyl (number of carbon atoms in the alkyl group is preferably from 1 to 10) methacrylates (e.g., methyl methacrylate, ethyl methacrylate, propyl methacrylate, isopropyl methacrylate, tert-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate) and aryl methacrylates (e.g., phenyl methacrylate, cresyl methacrylate and naphthyl methacrylate).

Specific examples of the acrylamides include acrylamide, N-alkylacrylamides (the alkyl group preferably has 1 to 10 carbon atoms, for example, methyl, ethyl, propyl, butyl, tert-butyl, heptyl, octyl, cyclohexyl, benzyl or hydroxyethyl group), N-arylacrylamides (the aryl group includes, for example, phenyl, tolyl, nitrophenyl, naphthyl, cyanonaphthyl, hydroxyphenyl or carboxyphenyl group), N,N-dialkylacrylamides (the alkyl group preferably has 1 to 10 carbon atoms, for example, methyl, ethyl, butyl, isobutyl, ethylhexyl or cyclohexyl group), N,N-diarylacrylamides (the aryl group includes, for example, phenyl group), N-methyl-N-phenylacrylamide, N-hydroxyethyl-N-methylacrylamide and N-2-acetamidoethyl-N-acetylacrylamide.

Specific examples of the methacrylamides include methacrylamide, N-alkylmethacrylamides (the alkyl group preferably has 1 to 10 carbon atoms, for example, methyl, ethyl, tert-butyl, ethylhexyl, hydroxyethyl or cyclohexyl group), N-arylmethacrylamides (the aryl group includes, for example, phenyl group), N,N-dialkylmethacrylamides (the alkyl group includes, for example, ethyl, propyl or butyl group), N,N-diarylmethacrylamides (the aryl group include, for example, phenyl group), N-hydroxyethyl-N-methylmethacrylamide, N-methyl-N-phenyl-methacrylamide and N-ethyl-N-phenylmethacrylamide.

Specific examples of the allyl compounds include allyl esters (e.g., allyl acetate, allyl caproate, allyl caprylate, allyl laurate, allyl palmitate, allyl stearate, allyl benzoate, allyl acetoacetate or allyl lactate) and allyloxy ethanol.

Specific examples of the vinyl ethers include alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether or tetrahydrofurfuryl vinyl ether) and vinyl aryl ethers (e.g., vinyl phenyl ether, vinyl tolyl ether, vinyl chlorophenyl ether, vinyl 2,4-dichlorophenyl ether, vinyl naphthyl ether or vinyl anthranyl ether).

Specific examples of the vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate, vinyl cyclohexanecarboxylate, vinyl benzoate, vinyl salicylate, vinyl chlorobenzoate, vinyl tetrachlorobenzoate and vinyl naphthoate.

Specific examples of the styrenes include styrene, alkyl-styrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethyl-styrene or acetoxymethylstyrene), alkoxystyrenes (e.g., methoxystyrene, 4-methoxy-3-methylstyrene or dimethoxystyrene), halogenostyrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene or 4-fluoro-3-trifluoromethylstyrene) and carboxystyrene.

Specific examples of the crotonic acid esters include alkyl crotonates (e.g., butyl crotonate, hexyl crotonate or glycerol monocrotonate).

Other copolymerizable monomers used include dialkyl itaconates (e.g., dimethyl itaconate, diethyl itaconate, and dibutyl itaconate), dialkyl esters of maleic acid or fumaric acid (e.g., dimethyl maleate and dibutyl fumalate), maleic anhydride; maleimide, acrylonitrile, methacrylonitrile and maleonitrile. In general, other copolymerizable addition polymerizable unsaturated compounds may also be used.

Among the monomers, monomers improving the solubility in alkali, for example, a monomer having carboxyl group, e.g., carboxystyrene, N-(carboxyphenyl)acrylamide or N-(carboxyphenyl)methacrylamide, or maleimide is preferred as the copolymer component.

The content of other monomers in the resin is preferably 50 mol % or less, and more preferably 30 mol % or less, based on the total repeating units.

Specific examples of the resin having the repeating structural unit represented by formula (b) are shown below, but the invention is not limited thereto.

(1)

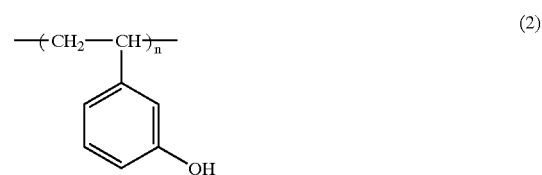

(2)

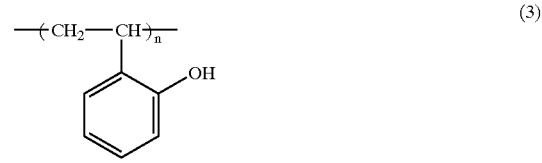

(3)

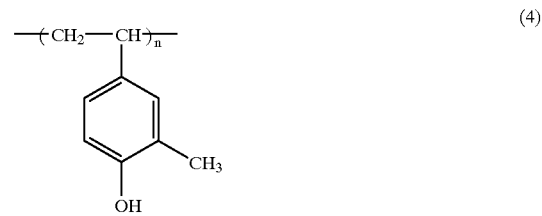

(4)

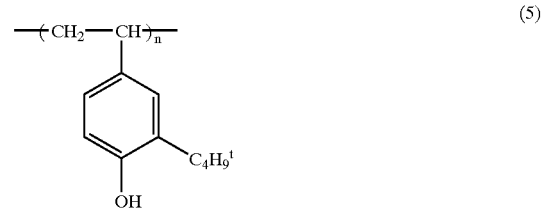

(5)

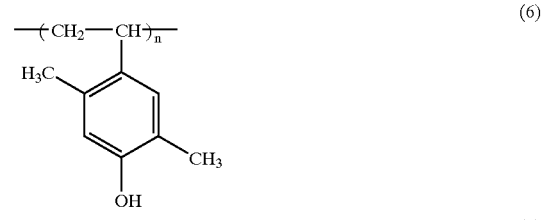

(6)

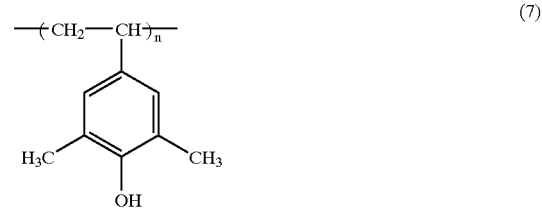

(7)

(8)
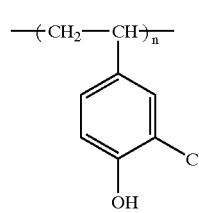
(9)
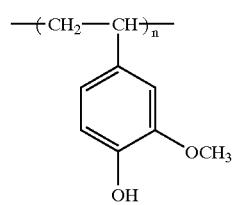
(10)
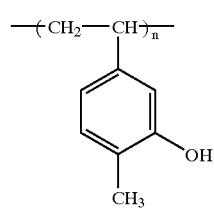
(11)
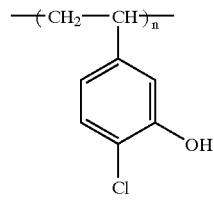
(12)
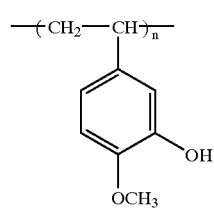
(13)
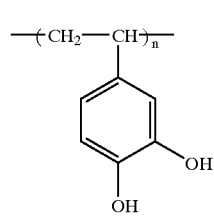
(14)
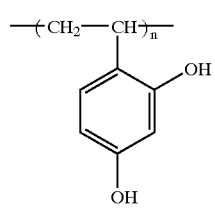
(15)
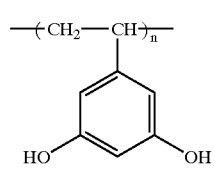
(16)
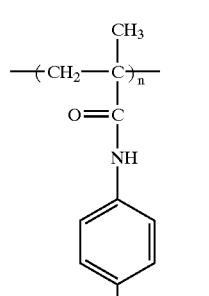
(17)
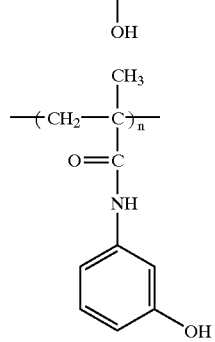
(18)
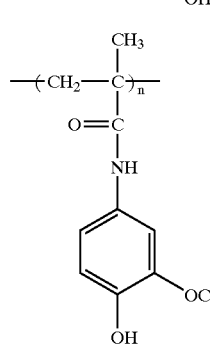
(19)
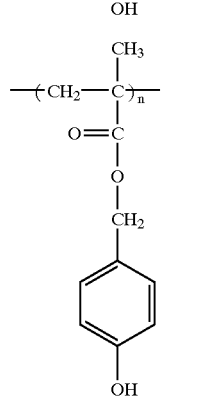

(20)
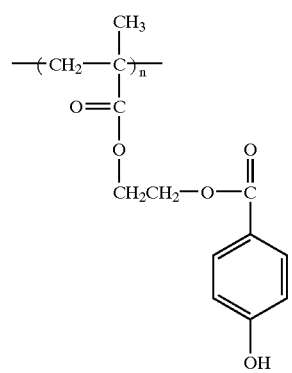
(21)
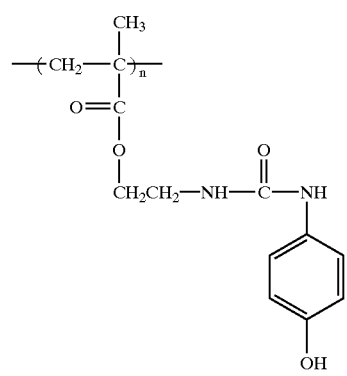
(22)
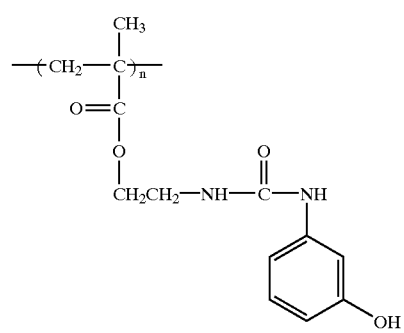
(23)
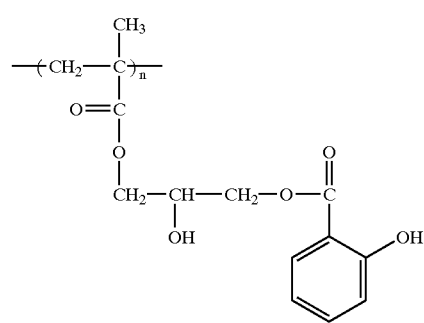
(24)
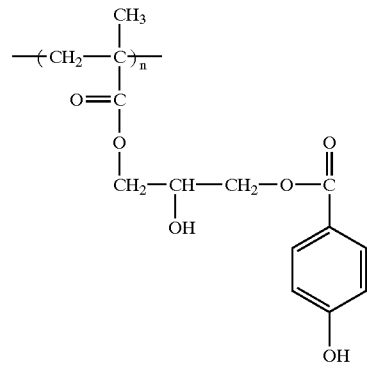
(25)
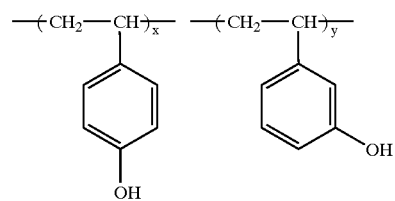
(26)
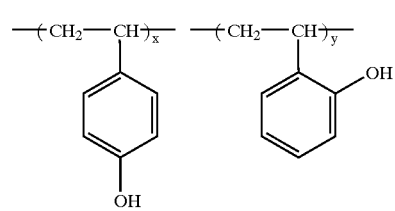
(27)
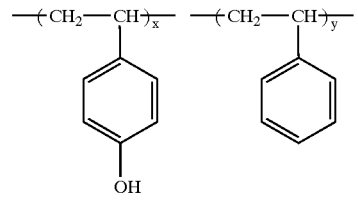
(28)
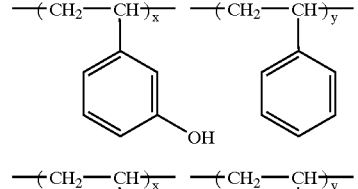
(29)
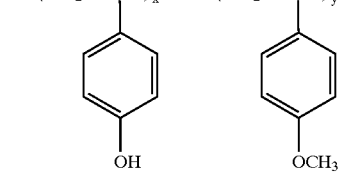
(30)
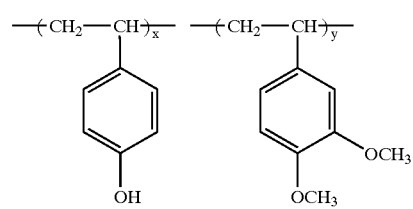

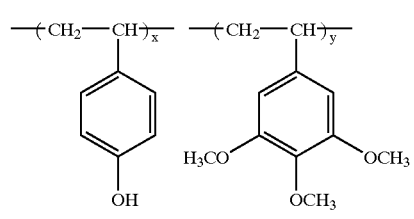 (31)
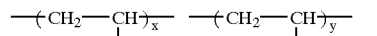 (32)
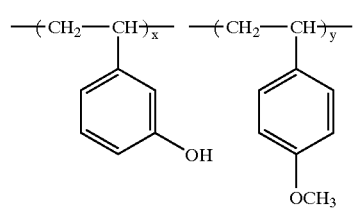 (33)
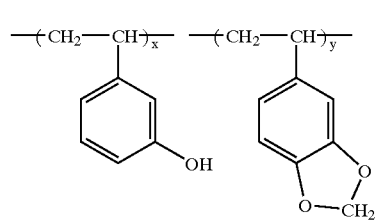 (34)
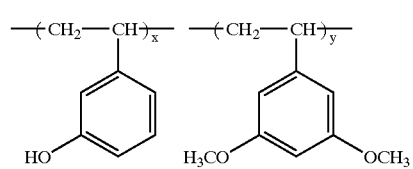 (35)
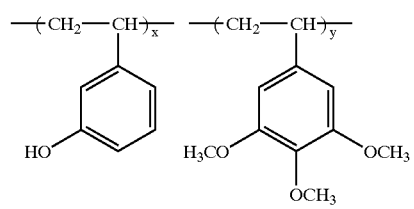 (36)
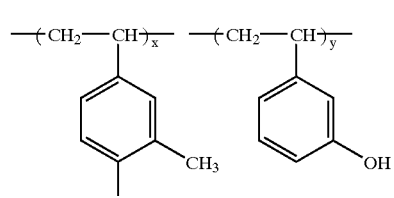 (37)
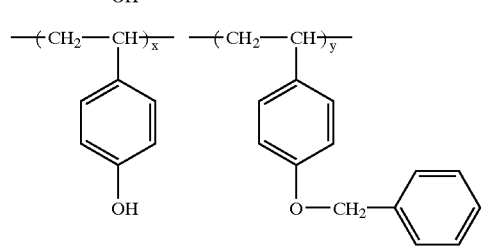 (38)
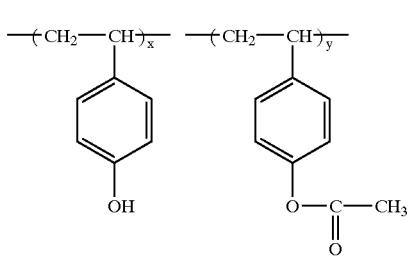 (39)
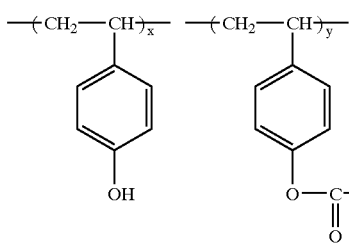 (40)
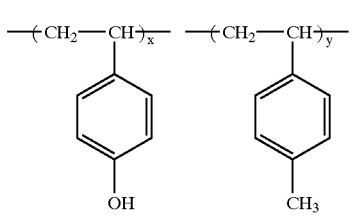 (41)
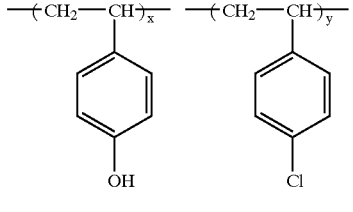 (42)
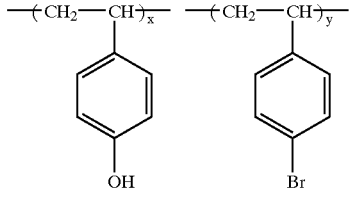 (43)
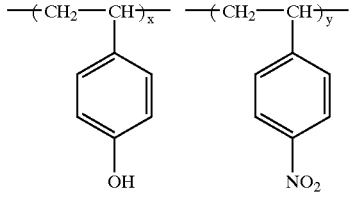 (44)
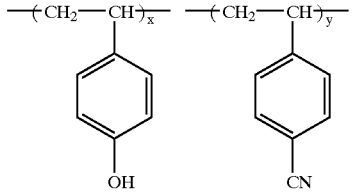 (45)

(46) 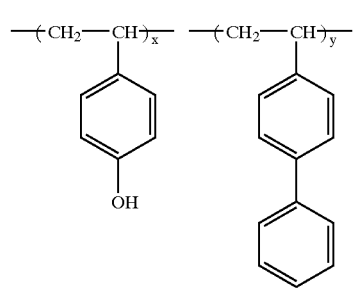
(47) 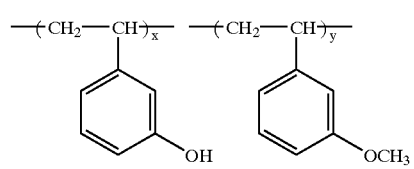
(48) 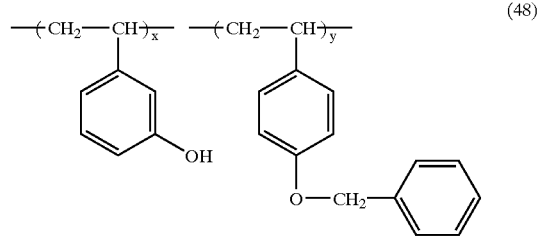
(49) 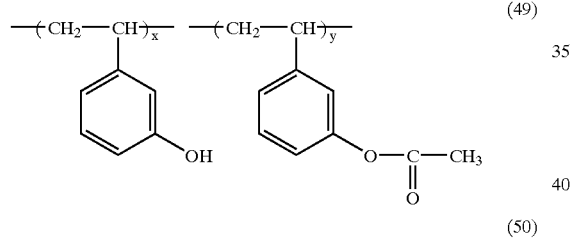
(50) 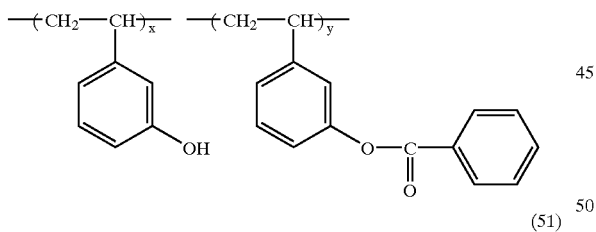
(51) 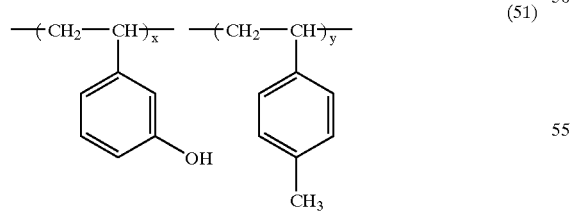
(52) 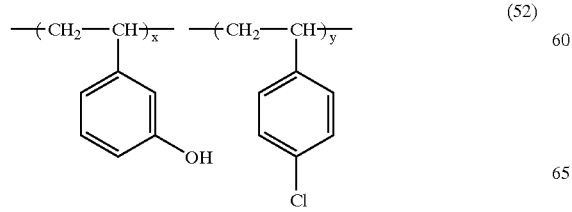
(53) 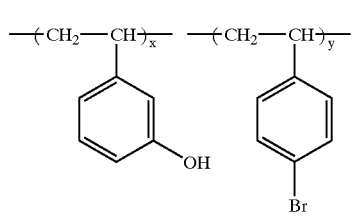
(54) 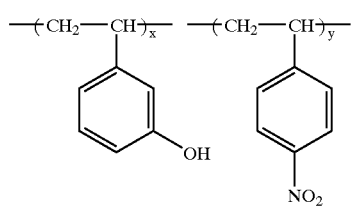
(55) 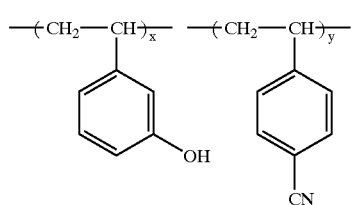
(56) 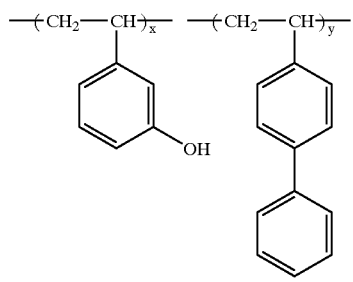
(57) 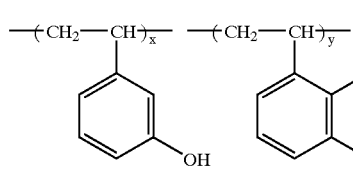
(58) 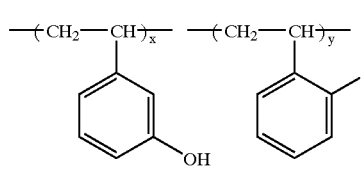
(59) 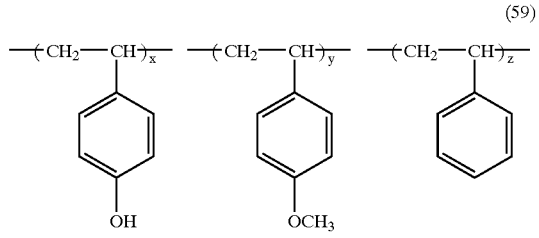

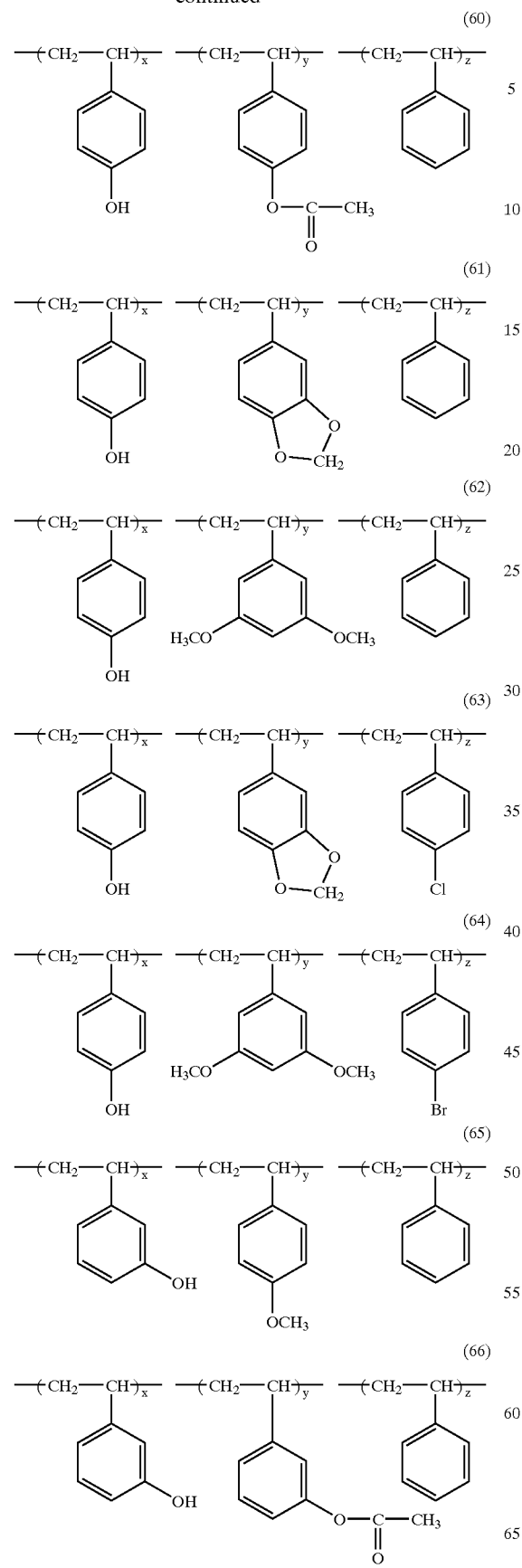

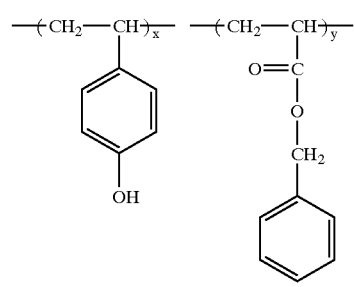 (74)
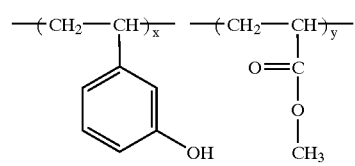 (75)
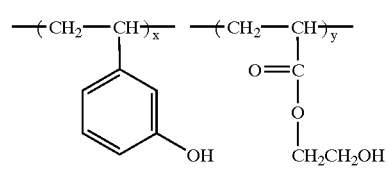 (76)
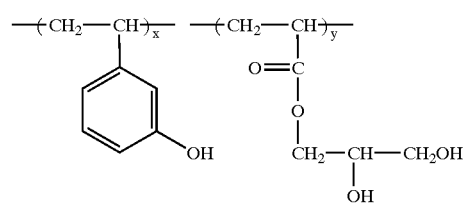 (77)
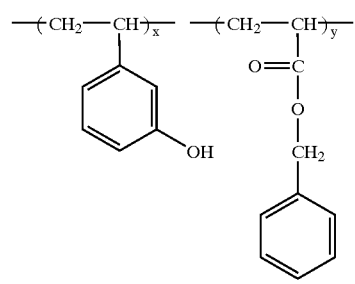 (78)
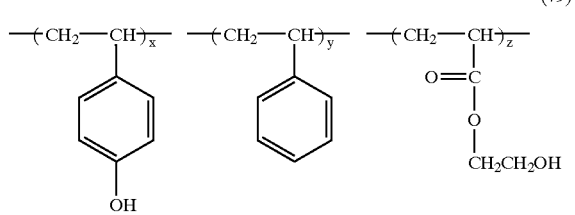 (79)
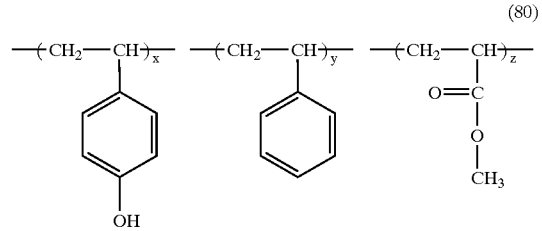 (80)
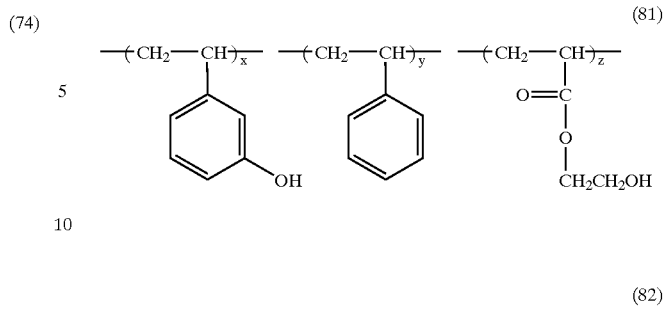 (81)
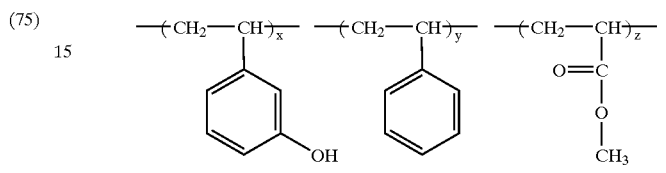 (82)
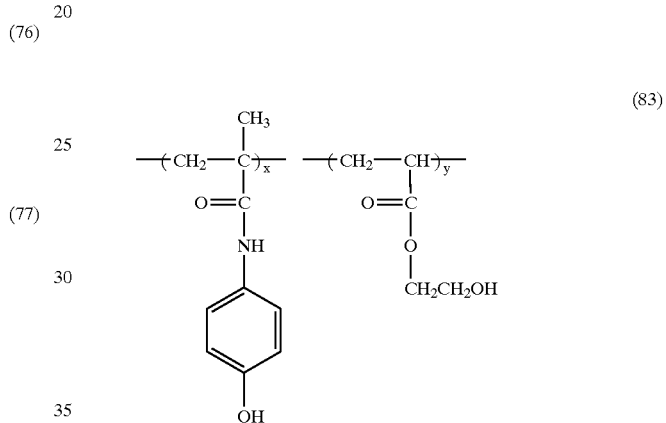 (83)
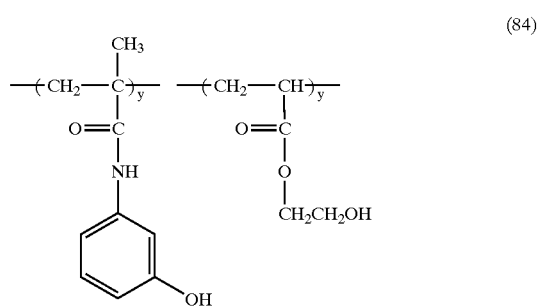 (84)
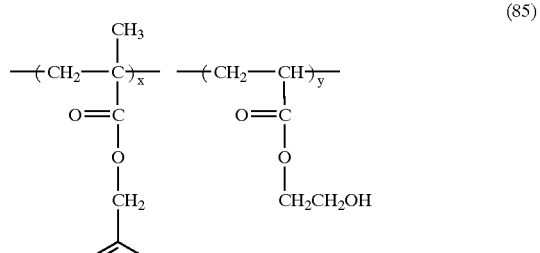 (85)
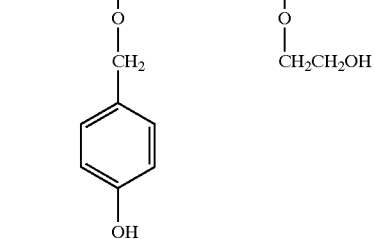

-continued

(86)
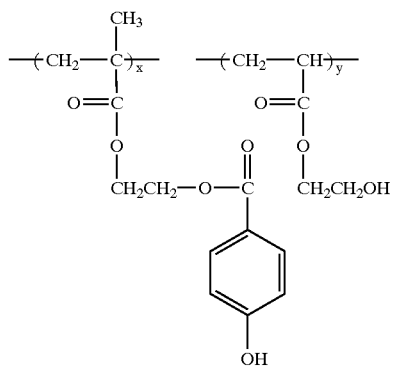

(87)
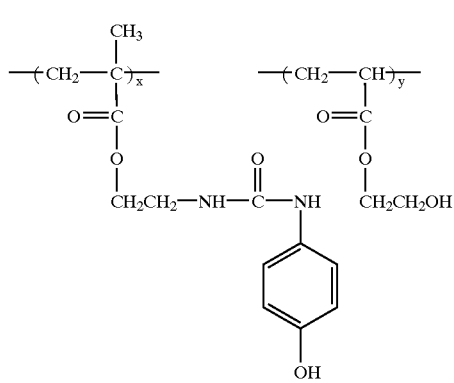

(88)
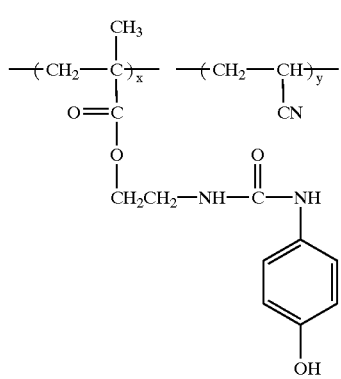

(89)
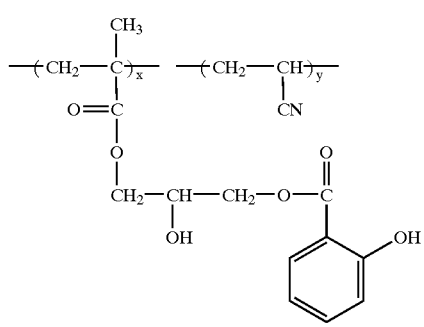

-continued

(90)
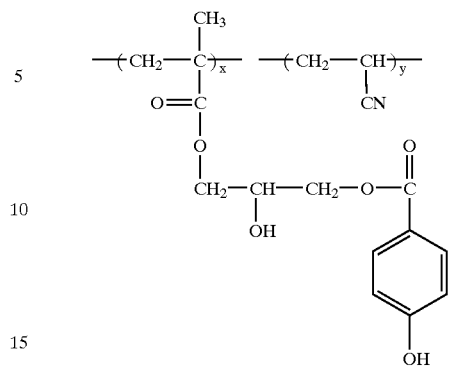

(91)

(92)

In the specific examples described above, n represents a positive integer, and x, y and z each represents a molar ratio of each repeating unit. In the resins composed of two components, x and y are used in the range of x=10 to 95 and y=5 to 90, and preferably x=40 to 90 and y=10 to 60. In the resin composed of three components, x, y and z are used in the range of x=10 to 90, y=5 to 85 and z=5 to 85, and preferably x=40 to 80, y=10 to 50 and z 10 to 50.

The molecular weight of the resin (B), preferably the resin having the repeating unit represented by formula (b), is preferably from 1,000 to 200,000, and more preferably from 3,000 to 50,000 in terms of a weight average molecular weight. The molecular weight distribution of the resin is in the range of 1 to 10, preferably 1 to 3, and more preferably 1 to 1.5. As the molecular weight distribution is smaller, the resolution is higher, the pattern profile is better, the sidewalls of the resist patterns are smoother, and the resist patterns are excellent in the roughness property.

The content of the repeating unit represented by formula (b) is from 5 to 100 mol %, and preferably from 10 to 90 mol %, based on the total resins.

The alkali-soluble resin containing the structural unit represented by formula (b) used in the invention can be synthesized by methods described in *Macromolecules*, 28(11), 3787–3789 (1995), *Polym. Bull.* (Berlin), 24(4), 385–389 (1990), and Japanese Patent Laid-Open No. 286375/1996. Specifically, the desired alkali-soluble resin can be obtained by a radical polymerization method or a living anion polymerization method.

These resins may be used singly or as a mixture of two or more thereof.

The weight average molecular weight is a value determined by gel permeation chromatography and indicated in terms of polystyrene.

The alkali-dissolving rate of the alkali-soluble resin is preferably at least 20 angstrom/second, and particularly preferably at least 200 angstrom/second, measured with 0.261N tetramethylammonium hydroxide (TMAH) at 23° C.

The alkali-soluble resin of the invention may be used singly or together with other alkali-soluble resins. The amount of other alkali-soluble resins used is at most 100 parts by weight based on 100 parts by weight of the alkali-soluble resin of the invention. Examples of other alkali-soluble resins used in combination include novolak resins, hydrogenated novolak resins, acetone-pyrogallol resins, styrene-maleic anhydride copolymers, carboxyl group-containing methacrylic resins and derivatives thereof, but the invention is not limited thereto.

The addition amount of the resin (B) is in the range of 30 to 95% by weight, preferably 40 to 90% by weight, and more preferably 50 to 80% by weight based on the whole solid content of the composition.

Moreover, the alkali-soluble resin (B) used in the invention preferably includes a resin having a repeating unit represented by the formula (b-2) or (b-3) described above.

In formulae (b-2) and (b-3), $R_1$ has the same meaning as $R_1$ in formula (b).

A has the same meaning as A in formula (b).

$R_{101}$ to $R_{106}$ each preferably represents a hydroxyl group, a carboxyl group, an amino group, a linear, branched or cyclic alkyl group having 1 to 12 carbon atoms, an alkoxy group, an alkylcarbonyloxy group, an alkylsulfonyloxy group, an alkenyl group, an aryl group, an aralkyl group, an N-alkylamino group or an N-dialkylamino group. More preferred is a hydroxyl group, a linear or branched alkyl group having 1 to 6 carbon atoms, an alkoxy group having 1 to 6 carbon atoms, an alkylcarbonyloxy group having 1 to 6 carbon atoms or a phenyl group, and particularly preferred is a hydroxyl group, a linear or branched alkyl group having 1 to 4 carbon atoms (e.g., methyl, ethyl, n-propyl, n-butyl or tert-butyl group), an alkoxy group having 1 to 3 carbon atoms (e.g., methoxy or ethoxy group) or a phenyl group. a to f each represents an integer of 0 to 3, preferably an integer of 0 to 2.

The liner or branched alkyl group in the alkyl group, alkoxy group, alkylcarbonyloxy group, alkylsulfonyloxy group, N-alkylamino group or N-dialkylamino group preferably includes methyl, ethyl, propyl, n-butyl, sec-butyl, hexyl, 2-ethylhexyl and octyl groups. The cyclic alkyl group may be monocyclic or polycyclic. The monocyclic cyclic alkyl group preferably includes cyclopropyl, cyclopentyl and cyclohexyl groups. The polycyclic cyclic alkyl group preferably includes adamantyl, norbornyl, isobornyl, dicyclopentyl, α-pinenyl and tricyclodecanyl groups.

The alkenyl group preferably includes vinyl, allyl, butenyl and cyclohexenyl groups.

The aryl group preferably includes phenyl, tolyl, dimethylphenyl, 2,4,6-trimethylphenyl, naphthyl and anthryl groups.

The aralkyl group preferably includes benzyl, phenethyl and naphthylmethyl groups.

Y represents a condensed polycyclic aromatic structure selected from those described above.

In the condensed polycyclic aromatic structure represented by Y, the position of bond connecting to the main chain or the position of bond connecting to a substituent may be any position on the condensed polycyclic aromatic structure.

The content of the repeating unit represented by formulae (b-2) and/or (b-3) in the resin used in the invention is preferably from 3 to 50 mol %, and more preferably 5 to 40 mol %, based on the total repeating units.

Specific examples of the alkali-soluble resin having a condensed polycyclic aromatic structure used in the invention are shown below, but the invention is not limited thereto.

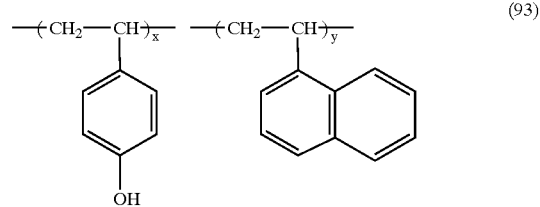

(93)

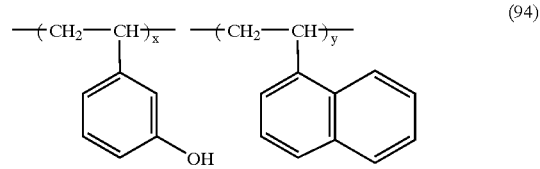

(94)

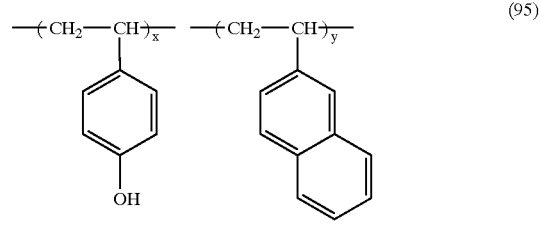

(95)

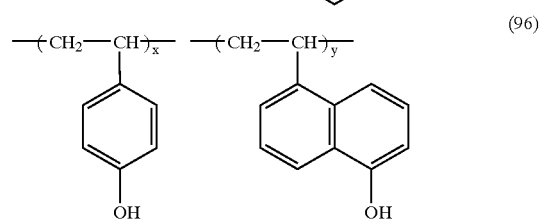

(96)

(97) 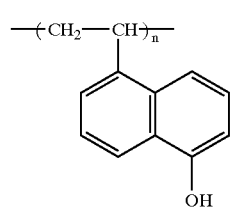

(98) 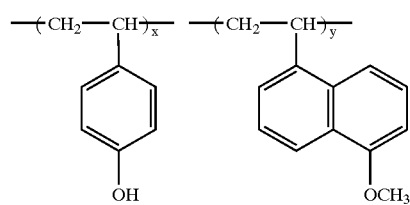

(99) 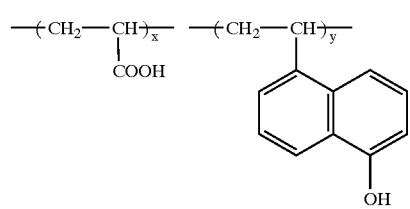

(100) 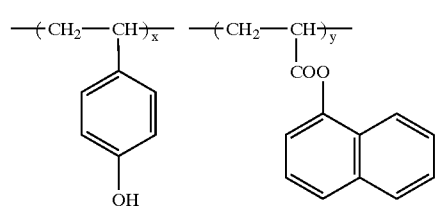

(101) 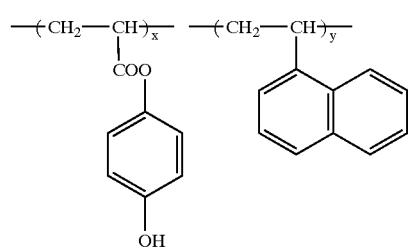

(102) 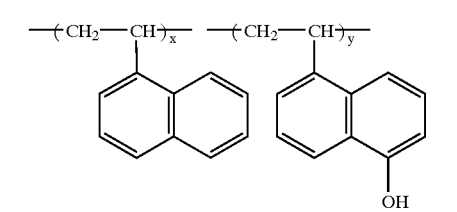

(103) 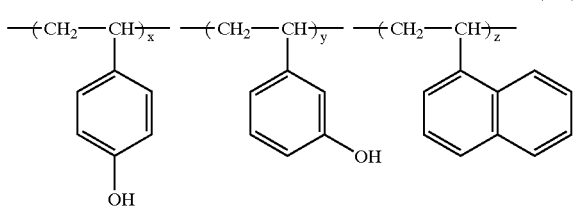

(104) 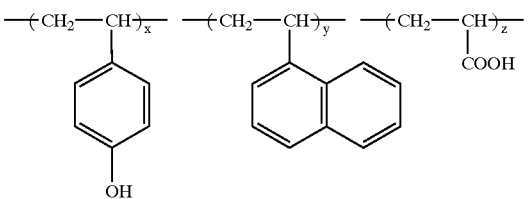

(105) 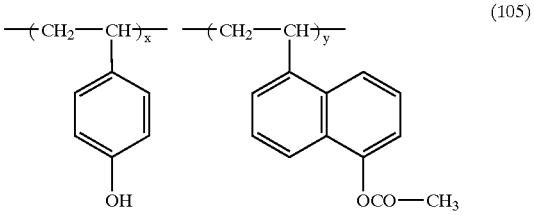

(106) 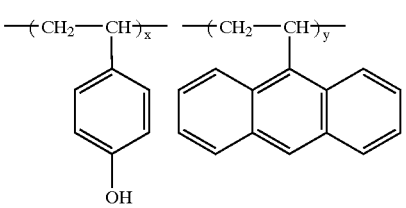

(107) 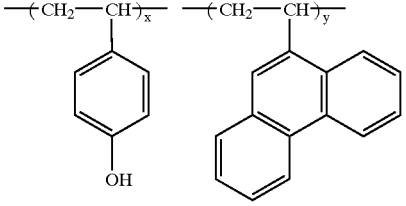

(108) 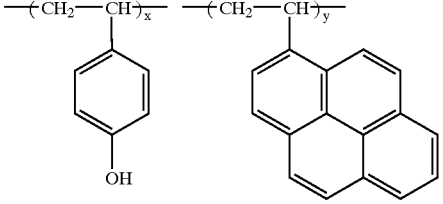

(2) Compound (A) Generating a Sulfonic Acid by Irradiation of Electron Beams or X-rays Used in the Invention:

The compound (A) used in the invention includes any compound generating a sulfonic acid by the irradiation of electron beams or X-rays.

Specifically, the compound generating a sulfonic acid by the irradiation of electron beams or X-rays used can be appropriately selected from photo initiators for photo cationic polymerization, photo initiators for photo radical polymerization, photo achromatic agents for dyes, photo discoloring agents, known compounds generating a sulfonic acid by light used for microresists, and a mixture thereof.

Also, compounds in which a group or compound generating a sulfonic acid by the irradiation of electron beams or X-rays is introduced into the main chain or side chain of a polymer, for example, compounds described in Japanese Patent Laid-Open No. 26653/1988, Japanese Patent Laid-Open No. 164824/1980, Japanese Patent Laid-Open No. 69263/1987, Japanese Patent Laid-Open No. 146038/1988, Japanese Patent Laid-Open No. 163452/1988, Japanese Patent Laid-Open No. 153853/1987 and Japanese Patent Laid-Open No. 146029/1988 can be used.

Further, the compounds generating a sulfonic acid by light described in U.S. Pat. No. 3,779,778 and European Patent 126,712 can be used.

Moreover, known onium salts, for example, diazonium salts, phosphonium salts, iodonium salts, sulfonium salts or selenonium salts, organohalogen compounds, o-nitrobenzylsulfonate compounds, N-iminosulfonate compounds, N-imidosulfonate compounds, diazosulfone compounds, diazodisulfone compounds and disulfone compounds can be used.

Preferred compounds include sulfonate compounds of sulfonium or iodonium, sulfonic acid ester compounds of N-hydroxyimide and disulfonyldiazomethane compounds.

Among the compounds, in particular, N-imidosulfonate compounds described in Japanese Patent Laid-Open No. 7653/1998 and Japanese Patent Laid-Open No. 2901/1999, diazodisulfone compounds described in Japanese Patent Laid-Open No. 210960/1992 and European Patent 417,557, and sulfonium salts and iodonium salts represented by formulae (I) to (III) shown below are preferred. The sulfonium salts and iodonium salts represented by formulae (I) to (III) are most preferred.

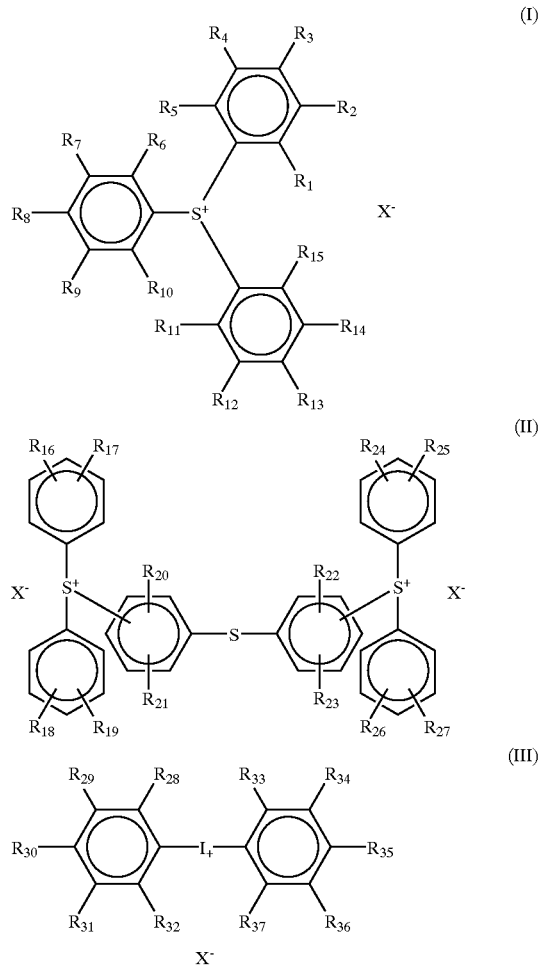

In formulae (I) to (III), $R_1$ to $R_{37}$ each represents a hydrogen atom, an alkyl group, an alkoxy group, a hydroxyl group, a halogen atom or —S—$R_{38}$.

The alkyl group represented by $R_1$ to $R_{37}$ may be a linear, branched or cyclic alkyl group. The linear or branched alkyl group includes, for example, an alkyl group having 1 to 4 carbon atoms, e.g., methyl, ethyl, propyl, n-butyl, sec-butyl and tert-butyl groups. The cyclic alkyl group includes, for example, a cyclic alkyl group having 3 to 8 carbon atoms, e.g., cyclopropyl, cyclopentyl and cyclohexyl groups.

The alkoxy group represented by $R_1$ to $R_{37}$ may be a linear, branched or cyclic alkoxy group. The linear or branched alkoxy group includes an alkoxy group having 1 to 8 carbon atoms, e.g., methoxy, ethoxy, hydroxyethoxy, propoxy, n-butoxy, iso-butoxy, sec-butoxy, tert-butoxy and octyloxy groups. The cyclic alkoxy group includes, for example, cyclopentyloxy and cyclohexyloxy groups.

The halogen atom represented by $R_1$ to $R_{37}$ includes fluorine, chlorine, bromine and iodine atoms.

$R_{38}$ in —S—$R_{38}$ represented by $R_1$ to $R_{37}$ represents an alkyl group or an aryl group. The alkyl group represented by $R_{38}$ includes, for example, those described for the alkyl group represented by $R_1$ to $R_{37}$.

The aryl group represented by $R_{38}$ includes those having 6 to 14 carbon atoms, for example, phenyl, tolyl, methoxyphenyl and naphthyl groups.

The alkyl group, alkoxy group and aryl group represented by $R_1$ to $R_{38}$ each may further have a substituent to increase the number of carbon atoms, though, may not be substituted. Preferred examples of such substituents include an alkoxy group having 1 to 4 carbon atoms, an aryl group having 6 to 10 carbon atoms and an alkenyl group having 2 to 6 carbon atoms. Also, a cyano group, a hydroxyl group, a carboxyl group, an alkoxycarbonyl group and a nitro group are exemplified. In addition, a halogen atom, e.g., fluorine, chlorine or iodine atom may be used.

In the groups represented by $R_1$ to $R_{15}$ in formula (I), at least two groups thereof may combine with each other to form a ring. The ring may be formed by directly combining the terminals of the groups represented $R_1$ to $R_{15}$. Also, the ring may be formed by indirectly combining the groups represented $R_1$ to $R_{15}$ through one or more atoms selected from carbon, oxygen, sulfur and nitrogen. The ring structure formed by combining two or more groups represented by $R_1$ to $R_{15}$ includes, for example, a furan ring, a dihydrofuran ring, a pyran ring, a trihydropyran ring, a thiophene ring and a pyrrole ring. The same can be applied to $R_{16}$ to $R_{27}$ in formula (II), and two or more groups represented by $R_{16}$ to $R_{27}$ may combine with each other directly or indirectly to form a ring. The same can also be applied to $R_{28}$ to $R_{37}$ in formula (III) Each of formulae (I) to (III) has $X^-$. $X^-$ of formulae (I) to (III) is an anion of sulfonic acid. The sulfonic acid forming the anion is an acid selected from benzenesulfonic acid, naphthalenesulfonic acid and anthracenesulfonic acid. The acid has at least one fluorine atom as a substituent. Alternatively, the acid has at least one organic group selected from an alkyl group, an alkoxy group, an acyl group, an acyloxy group, a sulfonyl group, a sulfonyloxy group, a sulfonylamino group, an aryl group, an aralkyl group and an alkoxycarbonyl group together with the fluorine atom or in place of the fluorine atom, and the organic group has at least one fluorine atom as a substituent. The benzenesulfonic acid, naphthalenesulfonic acid or anthracenesulfonic acid described above may further be substituted, for example, with a halogen atom other than a fluorine atom, a hydroxyl group or a nitro group.

The alkyl group bonded to the acid such as benzenesulfonic acid forming the anion of $X^-$ includes, for example, an alkyl group having 1 to 12 carbon atoms. The alkyl group may be a linear, branched or cyclic alkyl group. The alkyl group is substituted with at least one fluorine atom, and preferably substituted with not more than 25 fluorine atoms.

Specific examples thereof include trifluoromethyl group, pentafluoroethyl group, 2,2,2-trifluoroethyl group, heptafluoropropyl group, heptafluoroisopropyl group, perfluorobutyl group, perfluorooctyl group, perfluorododecyl group and perfluorocyclohexyl group. Among the groups, a perfluoroalkyl group having 1 to 4 carbon atoms wherein all the hydrogen atoms are replaced by fluorine atoms is preferred.

The alkoxy group bonded to the acid such as benzenesulfonic acid singly or together with the alkyl group includes an alkoxy group having 1 to 12 carbon atoms. The alkoxy group may be a linear, branched or cyclic alkoxy group. The alkoxy group is substituted with at least one fluorine atom, and preferably substituted with not more than 25 fluorine atoms. Specific examples thereof include trifluoromethoxy group, pentafluoroethoxy group, heptafluoroisopropyloxy group, perfluorobutoxy group, perfluorooctyloxy group, perfluorododecyloxy group and perfluorocyclohexyloxy group. Among the groups, a perfluoroalkoxy group having 1 to 4 carbon atoms wherein all the hydrogen atoms are replaced by fluorine atoms is preferred.

The acyl group bonded to the acid such as benzenesulfonic acid singly or together with the alkyl group includes preferably an acyl group having 2 to 12 carbon atoms and substituted with 1 to 23 fluorine atoms. Specific examples thereof include trifluoroacetyl group, fluoroacetyl group, pentafluoropropionyl group and pentafluorobenzoyl group.

The acyloxy group bonded to the acid such as benzenesulfonic acid singly or together with the alkyl group includes preferably an acyloxy group having 2 to 12 carbon atoms and substituted with 1 to 23 fluorine atoms. Specific examples thereof include trifluoroacetoxy group, fluoroacetoxy group, pentafluoropropionyloxy group and pentafluorobenzoyloxy group.

The sulfonyl group bonded to the acid such as benzenesulfonic acid singly or together with the alkyl group includes preferably a sulfonyl group having 1 to 12 carbon atoms and substituted with 1 to 25 fluorine atoms. Specific examples thereof include trifluoromethanesulfonyl group, pentafluoroethanesulfonyl group, perfluorobutanesulfonyl group, perfluorooctanesulfonyl group, pentafluorobenzenesulfonyl group and 4-trifluoromethylbenzenesulfonyl group.

The sulfonyloxy group bonded to the acid such as benzenesulfonic acid singly or together with the alkyl group includes preferably a sulfonyloxy group having 1 to 12 carbon atoms substituted with 1 to 25 fluorine atoms. Specific examples thereof include trifluoromethanesulfonyloxy group, perfluorobutanesulfonyloxy group and 4-trifluoromethylbenzenesulfonyloxy group.

The sulfonylamino group bonded to the acid such as benzenesulfonic acid singly or together with the alkyl group includes preferably a sulfonylamino group having 1 to 12 carbon atoms and substituted with 1 to 25 fluorine atoms. Specific examples thereof include trifluoromethanesulfonylamino group, perfluorobutanesulfonylamino group, perfluorooctanesulfonylamino group and pentafluorobenzenesulfonylamino group.

The aryl group bonded to the acid such as benzenesulfonic acid singly or together with the alkyl group includes preferably an aryl group having 6 to 14 carbon atoms and substituted with 1 to 9 fluorine atoms. Specific examples thereof include pentafluorophenyl group, 4-trifluoromethylphenyl group, heptafluoronaphthyl group, nonafluoroanthranyl group, 4-fluorophenyl group and 2,4-difluorophenyl group.

The aralkyl group bonded to the acid such as benzenesulfonic acid singly or together with the alkyl group includes preferably an aralkyl group having 7 to 10 carbon atoms and substituted with 1 to 15 fluorine atoms. Specific examples thereof include pentafluorophenylmethyl group, pentafluorophenylethyl group, perfluorobenzyl group and perfluorophenthyl group.

The alkoxycarbonyl group bonded to the acid such as benzenesulfonic acid singly or together with the alkyl group includes preferably an alkoxycarbonyl group having 2 to 13 carbon atoms and substituted with 1 to 25 fluorine atoms. Specific examples thereof include trifluoromethoxycarbonyl group, pentafluoroethoxycarbonyl group, pentafluorophenoxycarbonyl group, perfluorobutoxycarbonyl group and perfluorooctyloxycarbonyl group.

Among the anions, more preferred $X^-$ is a fluorine-substituted benzenesulfonic acid anion, and pentafluorobenzenesulfonic acid anion is particularly preferred.

Moreover, the benzenesulfonic acid, naphthalenesulfonic acid, or anthracenesulfonic acid having a fluorine-containing substituent may be further substituted, for example, with a linear, branched or cyclic alkoxy group, an acyl group, an acyloxy group, a sulfonyl group, a sulfonyloxy group, a sulfonylamino group, an aryl group, an aralkyl group, an alkoxycarbonyl group (the ranges of carbon atom number of these groups are the same as those described above), a halogen atom (excluding fluorine), a hydroxyl group or a nitro group.

Specific examples of the compounds represented by formulae (I) to (III) are shown below, but the invention is not limited thereto.

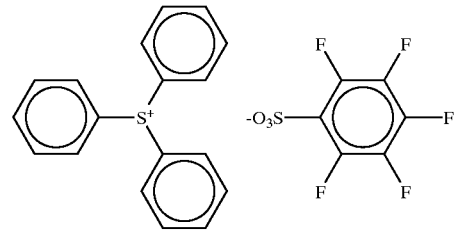

(I-1)

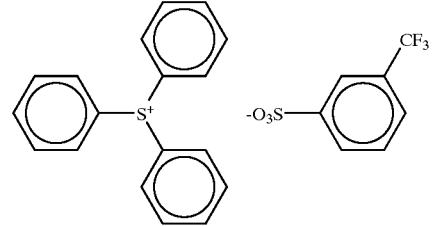

(I-2)

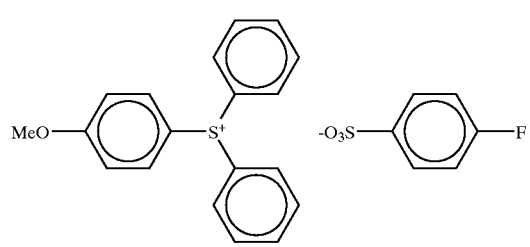

(I-3)

-continued
(I-4)
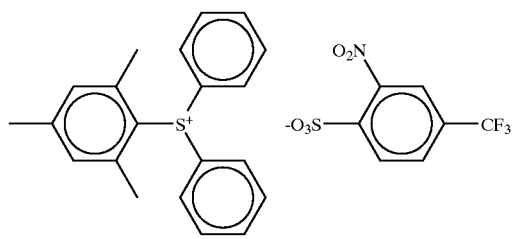
(I-5)
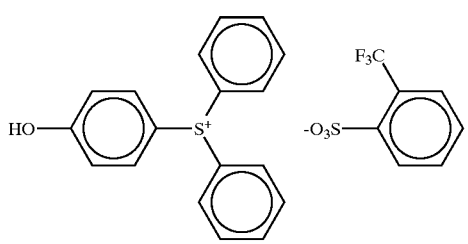
(I-6)
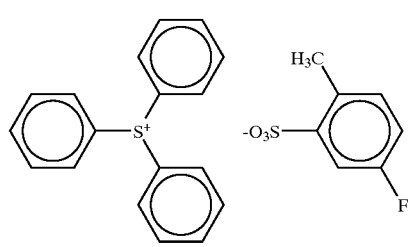
(I-7)
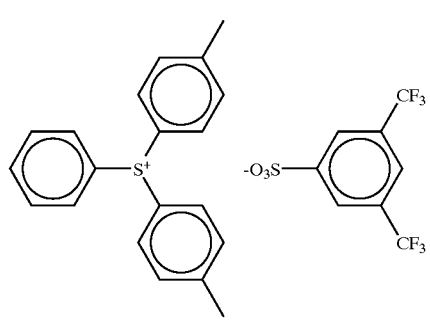
(I-8)
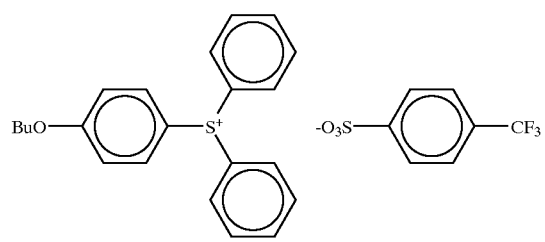
-continued
(I-9)
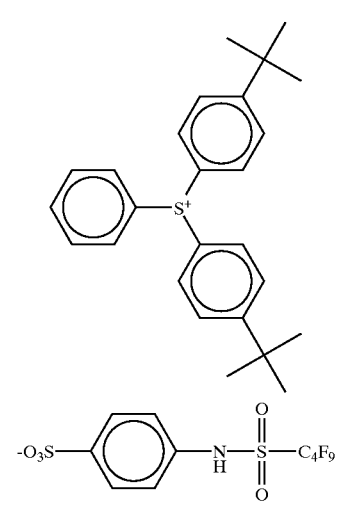
(I-10)
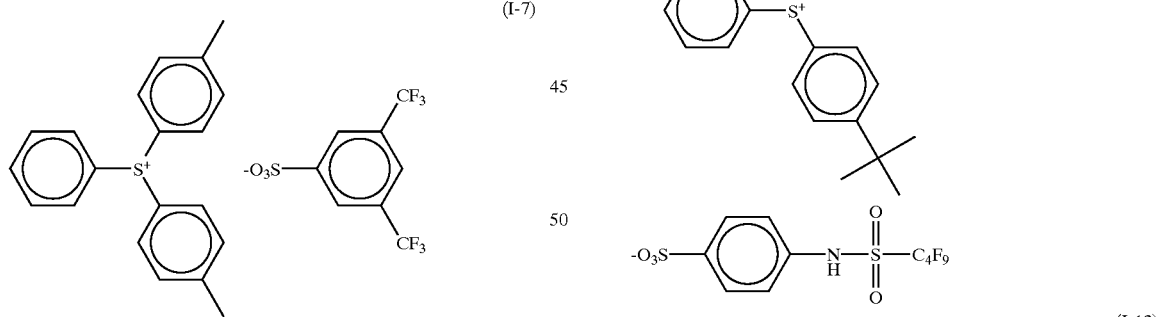
(I-11)
(I-12)
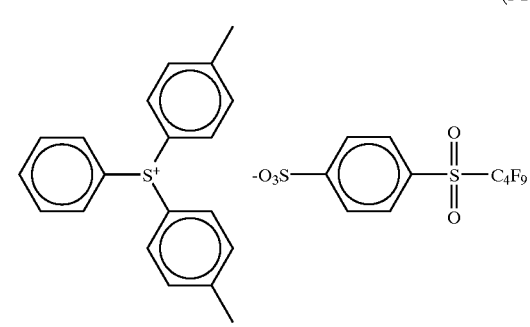

(I-13)
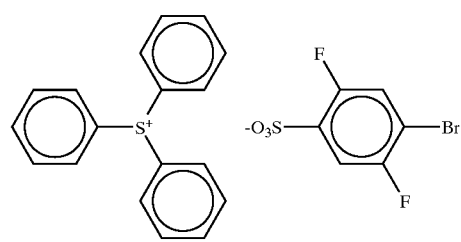
(I-14)
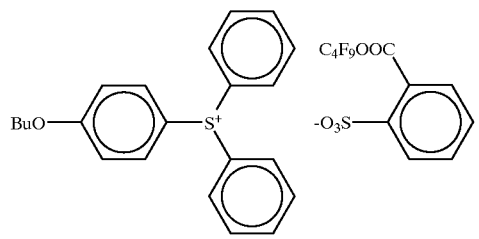
(II-1)
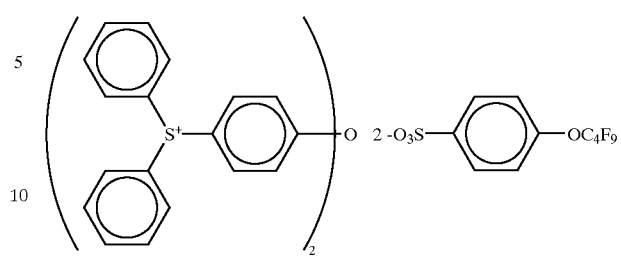
(II-2)
(II-3)
(II-4)
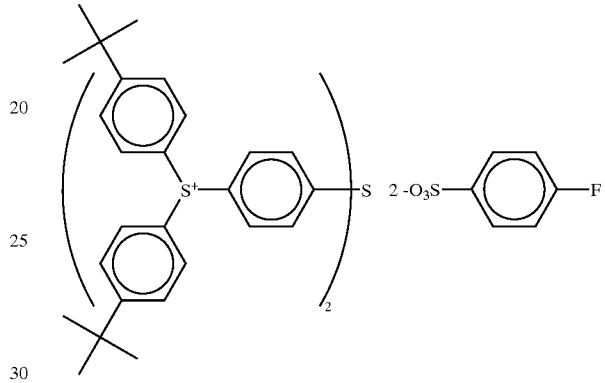
(II-5)
(III-1)
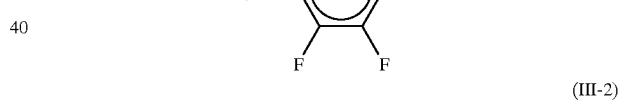
(III-2)
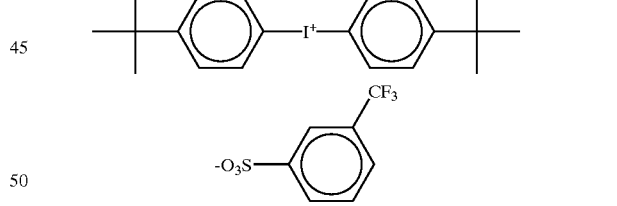
(III-3)
(III-4)
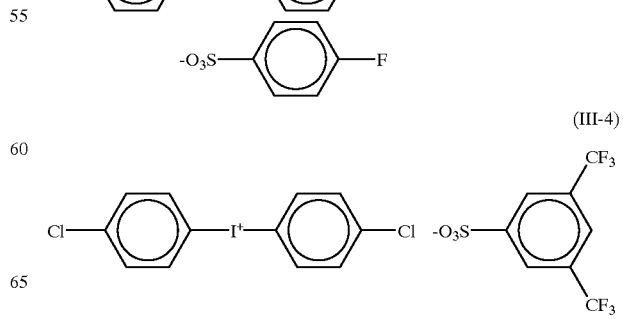

-continued

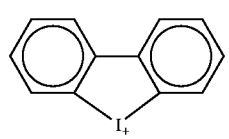
(III-5)

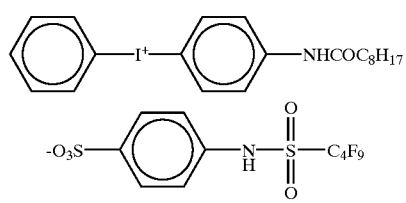
(III-6)

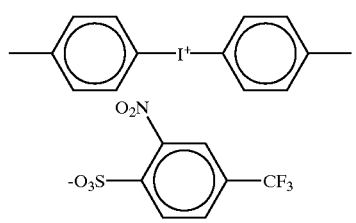
(III-7)

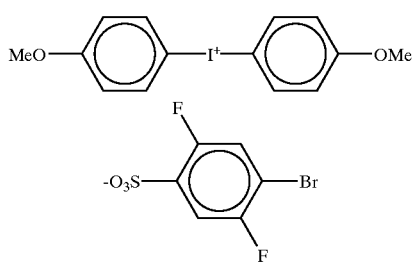
(III-8)

The compounds of formulae (I) and (II) can be synthesized by the following methods. For example, a method wherein an aryl Grignard reagent, e.g., arylmagnesium bromide is reacted with phenyl sulfoxide and the resulting triarylsulfonium halide is subjected to salt-exchange with a corresponding sulfonic acid is used. There is another method wherein phenyl sulfoxide and a corresponding aromatic compound are condensed using an acid catalyst, e.g., methanesulfonic acid/diphosphorus pentaoxide or aluminum chloride and the product is subjected to a salt-exchange. Alternatively, the compound can be synthesized by a method wherein a diaryl iodonium salt and diaryl sulfide are condensed using a catalyst, e.g., copper acetate and the product is subjected to a salt exchange. In any one of the above-described methods, phenyl sulfoxide may have a substituent on the benzene ring or may not have such a substituent.

The compound of formula (III) can be synthesized by reacting an aromatic compound using a periodate salt.

The content of component (A) used in the invention is suitably from 0.1 to 20% by weight, preferably from 0.5 to 10% by weight, and more preferably from 1 to 7% by weight, based on the whole solid content of the negative-working resist composition.

In the invention, in place of or together with the compound represented by the above formulae (I) to (III), other compounds generating a sulfonic acid through decomposition by the irradiation of electron beams or X-rays may be used.

In the case of using other compounds generating a sulfonic acid through decomposition by the irradiation of electron beams or X-rays together with the compound represented by formulae (I) to (III), the amount of other compounds generating a sulfonic acid through decomposition by the irradiation of electron beams or X-rays is not more than 80% by mole, preferably from 10 to 60% by mole, and more preferably from 20 to 50% by mole, based on the total amount of the compound represented by formulae (I) to (III) and the other compounds generating a sulfonic acid through decomposition by the irradiation of electron beams or X-rays.

(3) Acid crosslinking agent (C) used in the invention:

In the negative-working resist composition of the present invention, together with the alkali-soluble resin and the sulfonic acid generator, a compound crosslinking by the action of an acid (hereinafter, referred to as "an acid crosslinking agent" or simply "a crosslinking agent" sometimes) is used. In the invention, a known acid crosslinking agent can be effectively used.

Preferably, compounds or resins having at least two groups selected from a hydroxymethyl group, an alkoxymethyl group, an acyloxymethyl group and an alkoxymethyl ether group, and epoxy compounds are exemplified.

More preferably, alkoxymethylated or acyloxymethylated melamine compounds or resins, alkoxymethylated or acyloxymethylated urea compounds or resins, hydroxymethylated or alkoxymethylated phenol compounds or resins, and alkoxymethyl etherified phenol compounds or resins are used.

Specifically, a phenol derivative can be used as the crosslinking agent. A phenol derivative each having a molecular weight of 1,200 or less, containing from 3 to 5 benzene rings in the molecule thereof, and having at least two groups selected from hydroxymethyl group and an alkoxymethyl group, bonded concentrically to one of the benzene rings or dispersively to the benzene rings. By using such a phenol derivative, the effects of the invention can be more remarkably exhibited.

The alkoxymethyl group bonded to the benzene ring preferably includes an alkoxymethyl group having not more than 6 carbon atoms. Specific examples thereof include methoxymethyl, ethoxymethyl, n-propoxymethyl, isopropoxymethyl, n-butoxymethyl, isobutoxymethyl, sec-butoxymethyl and tert-butoxymethyl groups. An alkoxy-substituted alkoxy group, e.g., 2-methoxyethoxy or 2-methoxy-1-propyl group is also preferred.

Among the phenol derivatives, those particularly preferred are shown below.

37
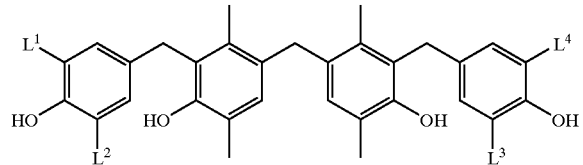
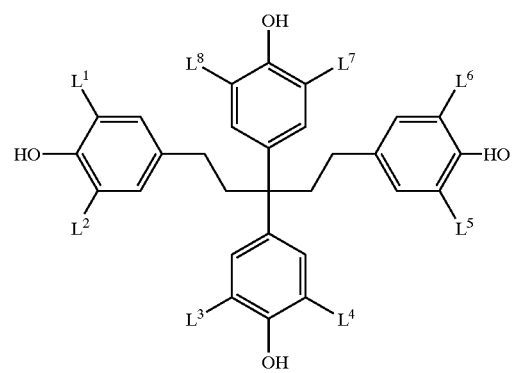
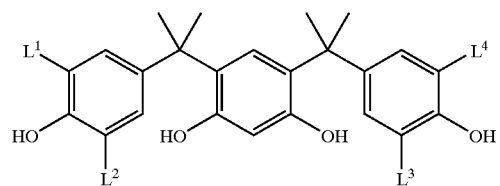
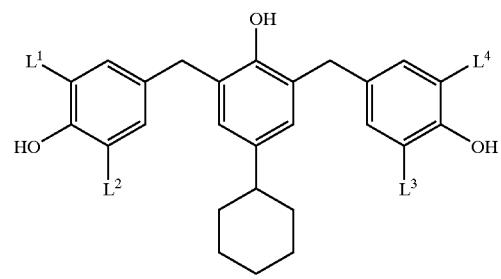
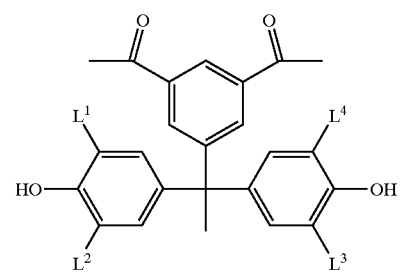
38
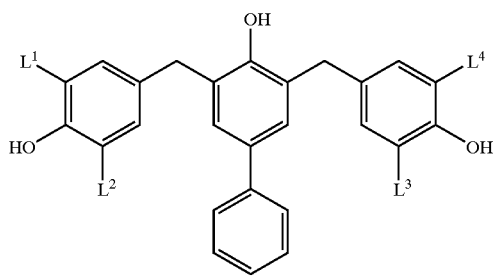
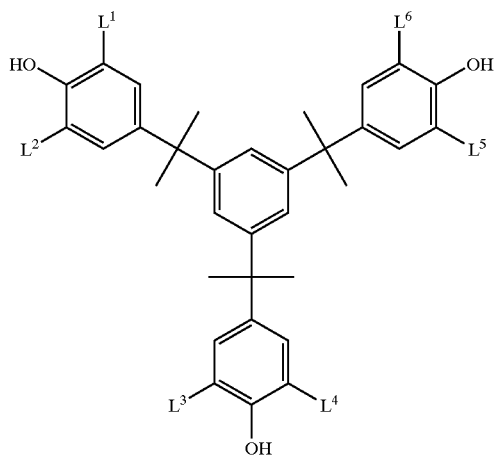
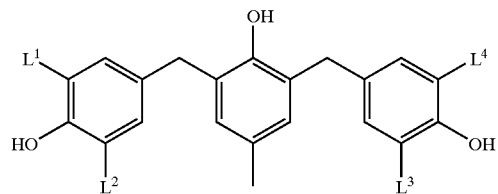
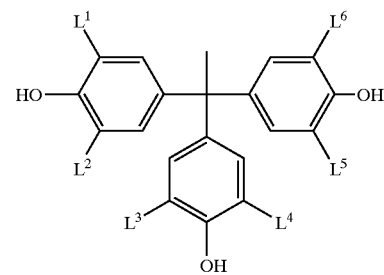
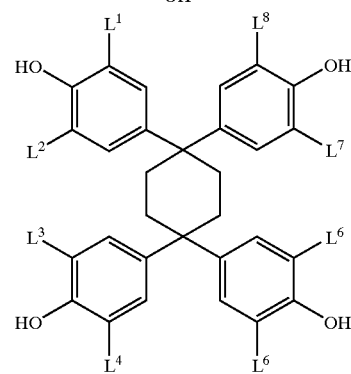

-continued
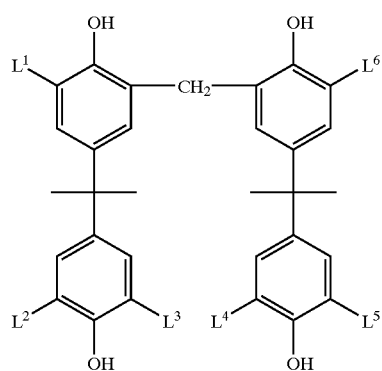
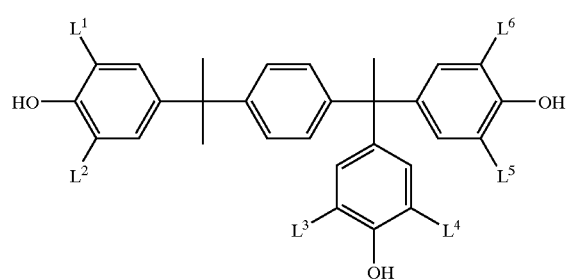
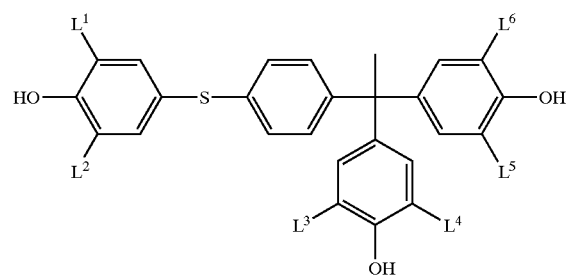
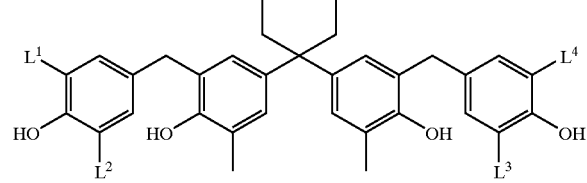
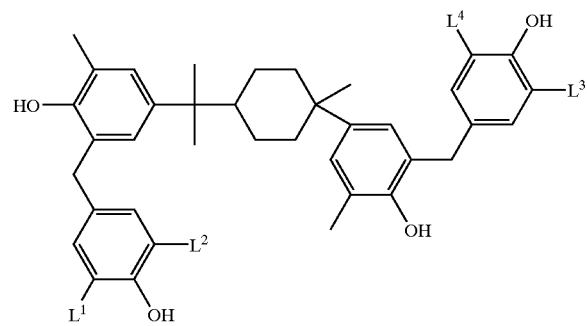
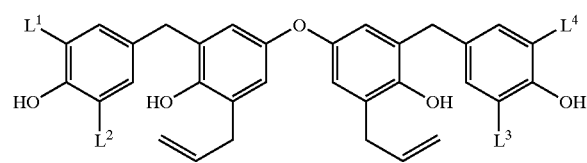
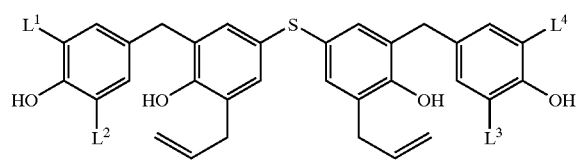
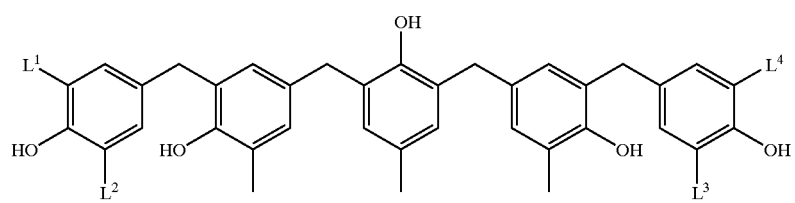

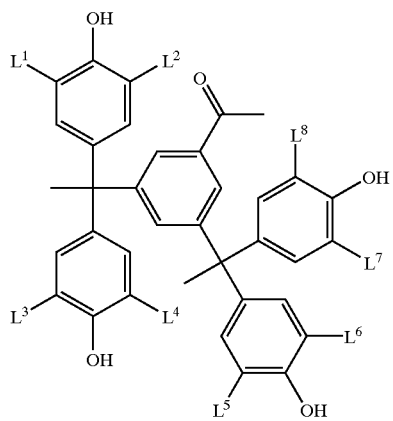

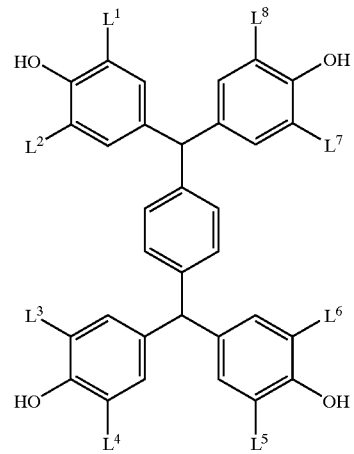

wherein, $L^1$ to $L^8$, which may be the same or different, each represents a hydroxymethyl group, a methoxymethyl group or an ethoxymethyl group.

The phenol derivative having a hydroxymethyl group can be obtained by reacting a corresponding phenol compound having no hydroxymethyl group (the compound represented by the above-described formula wherein $L^1$ to $L^8$ each is a hydrogen atom) with formaldehyde in the presence of a base catalyst. At that time, in order to prevent the occurrence of resinification or gelation, it is preferred to carry out the reaction at a temperature of not higher than 60° C. Specifically, the phenol derivative can be synthesized according to methods described, e.g., in Japanese Patent Laid-Open No. 282067/1994 and Japanese Patent Laid-Open No. 64285/1995.

The phenol derivative having an alkoxymethyl group can be obtained by reacting a corresponding phenol derivative having a hydroxymethyl group with an alcohol in the presence of an acid catalyst. At that time, in order to prevent the occurrence of resinification or gelation, it is preferred to carry out the reaction at a temperature of not higher than 100° C. Specifically, the phenol derivative can be synthesized according to methods described, e.g., in European Patent 632,003A1.

The phenol derivatives having a hydroxymethyl group or an alkoxymethyl group synthesized as described above are preferable in view of the storage stability, and the phenol derivatives having an alkoxymethyl group are particularly preferable from the viewpoint of the storage stability.

The phenol derivatives having at least two groups of hydroxymethyl group and alkoxymethyl group in total, wherein the groups are bonded concentrically to one of the benzene rings or dispersively to the benzene rings, may be used singly or as a combination of two or more thereof.

Other than the above-described phenol derivatives, the following compounds (i) and (ii) can be also used as the crosslinking agents.
(i) Compounds having an N-hydroxymethyl group, an N-alkoxymethyl group or an N-acyloxymethyl group
(ii) Epoxy compounds The crosslinking agent is used in an amount of 3 to 65% by weight, preferably 5 to 50% by weight, base on the whole solid content of the resist composition. When the amount of the crosslinking agent added is less than 3% by weight, the film-remaining ratio of the resist is lowered, and on the other hand, when the amount exceeds 65% by weight, the resolving power is lowered and further, it is undesirable in view of the storage stability of the resist liquid.

In the present invention, in addition to the phenol derivative, other crosslinking agents, for example, crosslinking agents (i) or (ii) described above may be used in combination.

The amount of other crosslinking agents which can be used in combination with the phenol derivative is ordinarily not more than 80% by mole, preferably from 10 to 60% by mole, and more preferably from 20 to 50% by mole, based on the total amount of the phenol derivative and the other crosslinking agents.

These crosslinking agents are described in detail below.

(i) Examples of the compound having an N-hydroxymethyl group, an N-alkoxymethyl group or an N-acyloxymethyl group include alkylated hexamethoxymelamine compounds disclosed in European Patent unexamined publication (hereinafter, referred to as "EP-A") 133,216, oligomer-hexamethoxymelamine-formaldehyde condensates disclosed in West German Patent 3,634,371, urea crosslinking agents having a melamine skeleton condensates disclosed in West German Patent 3,711,264, and alkoxy-substituted benzoguanamine-formaldehyde condensates disclosed in EP-A 212,482.

Preferred examples thereof include melamine-formaldehyde derivative having at least two free N-hydroxymethyl group, N-alkoxymethyl group and N-acyloxymethyl group. The melamine-formaldehyde derivative having N-alkoxymethyl groups is particularly preferred.

(ii) The epoxy compound includes a monomer, a dimer, an oligomer and a polymer containing at least one epoxy group. For example, a reaction product of bisphenol A and epichlorohydrin and a reaction product of a low molecular weight phenol-formaldehyde resin and epichlorohydrin are exemplified. Epoxy resins disclosed in U.S. Pat. No. 4,026,705 and British Patent 1,539,192 may also be used.

(4) Compound (D) Generating a Carboxylic Acid Represented by Formula (a) by the Irradiation of Electron Beams or X-rays Used in the Invention:

The compound (D) generating a carboxylic acid represented by formula (a) by the irradiation of electron beams or X-rays includes specifically a salt of a sulfonium or iodonium with a carboxylic acid represented by formula (a) or an ester compound of an N-hydroxyimide with a carboxylic acid represented by formula (a).

Among the compounds, compounds represented by the following formulae (c), (d) and (e) are preferred.

(c)

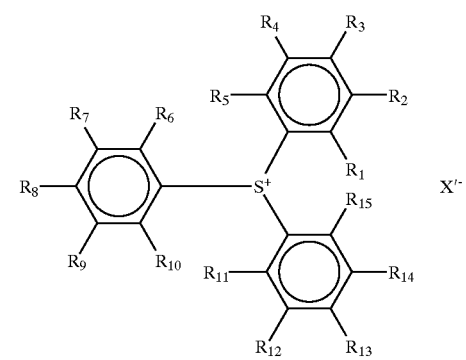

(d)

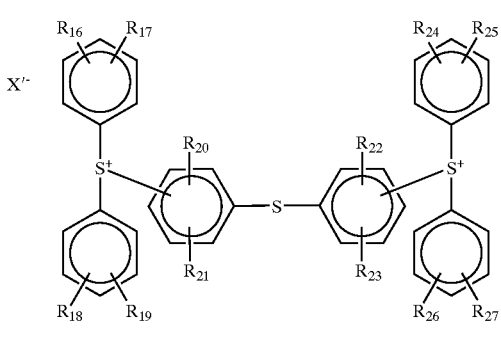

(e)

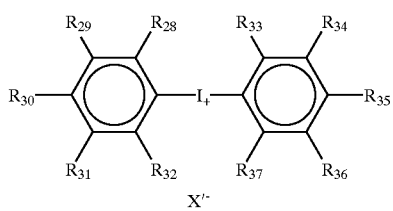

In formulae (c) to (e), $R_1$ to $R_{37}$ have the same meanings as $R_1$ to $R_{37}$ in formulae (I) to (III), respectively.

$X^{I-}$ represents $R_a$—COO—. $R_a$ represents an alkyl group having 1 to 4 carbon atoms or a perfluoroalkyl group having 1 to 8 carbon atoms, preferably an alkyl group having 1 to 3 carbon atoms or a perfluoroalkyl group having 1 to 6 carbon atoms, and particularly preferably methyl, ethyl, trifluoromethyl, pentafluoroethyl, heptafluoropropyl and nonafluorobutyl groups.

Specific examples of the compounds represented by formulae (c) to (e) are shown below, but the invention is not limited thereto.

c-1

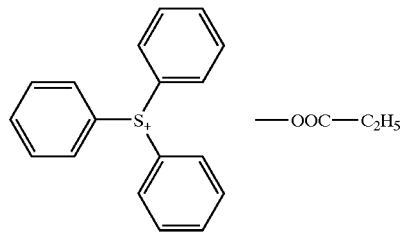

c-2 c-3

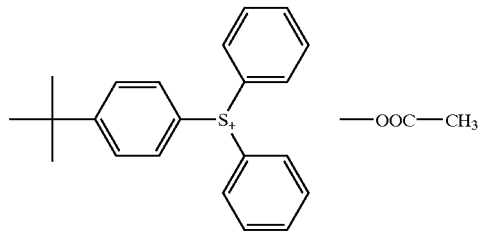

c-4

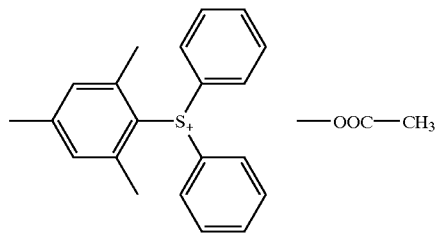

c-5

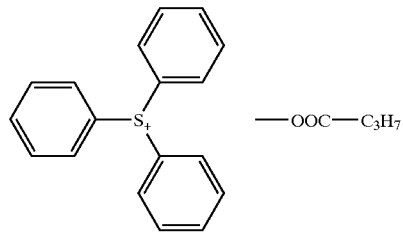

c-6

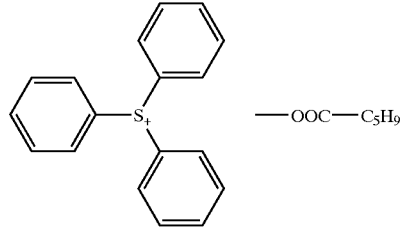

c-7

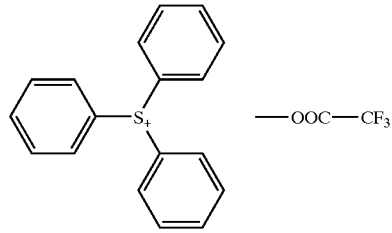

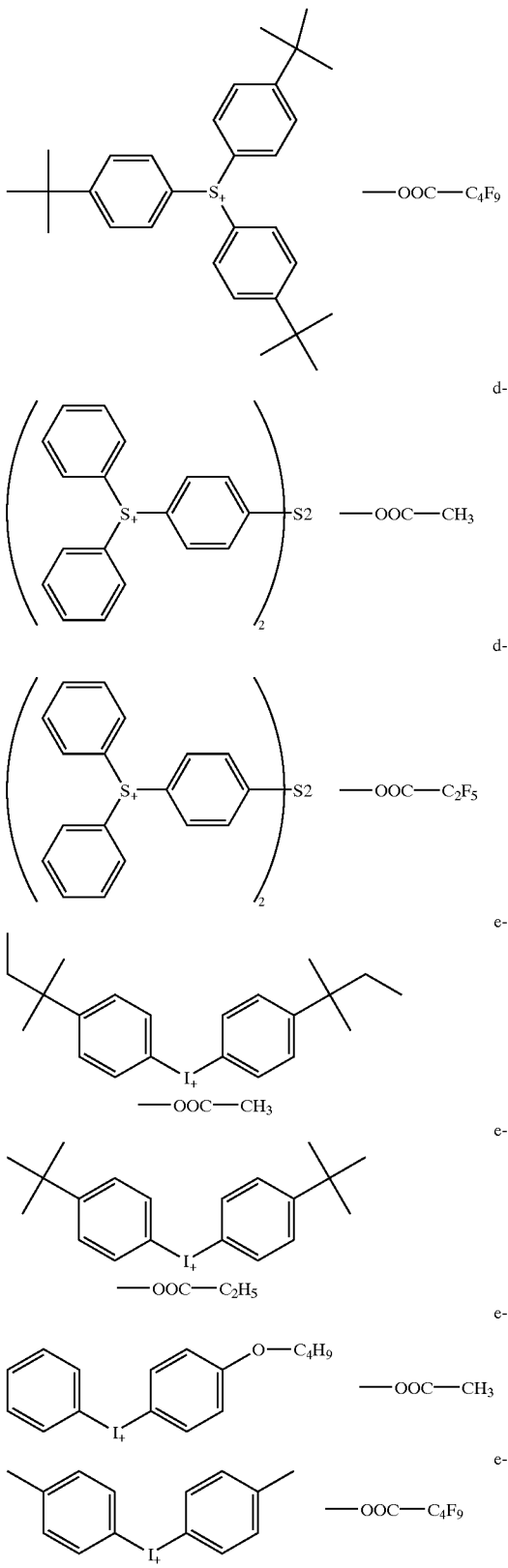

c-8 d-1 d-2 e-1 e-2 e-3 e-4

The content of the compound (D) used in the invention is suitably from 0.01 to 20% by weight, preferably from 0.02 to 10% by weight, and more preferably from 0.03 to 5% by weight, based on the whole solid content of the negative-working resist composition.

The compounds (D) are used singly or as a combination of two or more thereof.

Moreover, the ratio (weight ratio) of the compound (D) to the compound (A) is preferably from 1/200 to 1/1 and more preferably from 1/100 to 1/2.

(5) Other components used in the composition of the invention:

The negative-working resist composition of the invention may further contain other components, for example, a radical generator, a nitrogen-containing organic basic compound, a dye and a surface active agent, if desired.

(5)-1 Dye

Suitable dyes include oil dyes and basic dyes. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (these dyes are manufactured by Orient Chemical Industries, Ltd.), Crystal Violet (CI 42555), Methyl Violet (CI 42535), Rhodamine B (CI 45170B), Malachite Green (CI 42000) and Methylene Blue (CI 52015).

(5)-2 Nitrogen-containing Organic Basic Compound

A preferred organic basic compound which can be used in the invention is a compound having a basicity stronger than that of phenol. Among the compounds, a nitrogen-containing basic compound is preferably used.

Preferred chemical environments include a structure represented by the following formula (A), (B), (C), (D) or (E):

(A)

(B)

(C)

(D)

(E)

wherein $R^{250}$, $R^{251}$ and $R^{252}$, which may be the same or different, each represents a hydrogen atom, an alkyl group having 1 to 6 carbon atoms, an aminoalkyl group having 1 to 6 carbon atoms, a hydroxyalkyl group having 1 to 6 carbon atoms or a substituted or unsubstituted aryl group having 6 to 20 carbon atoms, or $R^{251}$ and $R^{252}$ may combine with each other to form a ring.

$R^{253}$, $R^{254}$, $R^{255}$ and $R^{256}$, which may be the same or different, each represents an alkyl group having 1 to 6 carbon atoms.

More preferable compounds are nitrogen-containing basic compounds having at least two nitrogen atoms of different chemical environments in one molecule. A compound containing both a substituted or unsubstituted amino group and a ring structure containing a nitrogen atom, and a compound containing an alkylamino group are particularly preferred.

Preferred specific examples include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted imidazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Particularly preferable compounds include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2, 4, 5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2, 4-diaminopyrimidine, 4,6-dihydroxypyrimidine, 2-pyrazoline, 3-pyrazoline, N-aminomorpholine and N-(2-aminoethyl)morpholine. However, the invention is not limited to these compounds.

The nitrogen-containing basic compounds are used singly or as a combination of two or more thereof.

With respect to a ratio of the acid generator and the organic basic compound in the composition, a molar ratio of (acid generator)/(organic basic compound) is preferably from 2.5 to 300. When the molar ratio is less than 2.5, the resolving power is sometimes lowered. On the other hand, when the molar ratio exceeds 300, the resist pattern sizes are changed with the passage of time from light exposure to heat treatment, and the resolving power is also sometimes lowered. The molar ratio of (acid generator)/(organic basic compound) is preferably from 5.0 to 200, and more preferably from 7.0 to 150.

(5)-3 Solvent

The resist composition of the invention is dissolved in a solvent capable of dissolving the components described above and applied to a support. Preferred examples of the solvent used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone and tetrahydrofuran. The solvents are used singly or as a mixture of two or more thereof.

(5)-4 Surface Active Agent

A surface active agent may be added to the above solvent. Specifically, the surface active agent used includes nonionic surface active agents, for example, polyoxyethylene alkyl ethers, e.g., polyoxyethylene lauryl ether, polyoxyethylene stearyl ether, polyoxyethylene cetyl ether or polyoxyethylene oleyl ether, polyoxyethylene alkylaryl ethers, e.g., polyoxyethylene octylphenol ether or polyoxyethylene nonylphenol ether, polyoxyethylene-polyoxypropylene block copolymers, sorbitan fatty acid esters, e.g., sorbitan monolaurate, sorbitan monopalmitate, sorbitan monostearate, sorbitan monooleate, sorbitan trioleate or sorbitan tristearate, polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate; fluorine-base or silicone-base surface active agents, e.g., Eftop EF 301, EF 303 and EF 352 (manufactured by Shin Akita Kasei K. K.), Megafac F171 and F173 (manufactured by Dainippon Ink & Chemicals, Inc.), Florad FC430 and FC431 (manufactured by Sumitomo 3M Ltd.), Asahiguard AG710, Surflon S-382, SC101, SC102, SC103, SC104, SC105 and SC106 (manufactured by Asahi Glass Co., Ltd.), Troysol S-366 (manufactured by Troy Chemical Corp.); organosiloxane polymer (KP341, manufactured by Shin-Etsu Chemical Co., Ltd.) and acrylic acid or methacrylic acid (co)polymer (Polyflow No. 75 and No. 95, manufactured by Kyoeisha Yushi Kagaku Kogyo K. K.). The amount of the surface active agent used is usually not more than 2 parts by weight, and preferably not more than 1 part by weight per 100 parts by weight of the solid content of the resist composition of the invention.

The surface active agents may be used singly or as a combination of two or more thereof.

The pattern formation process on a resist film in the production of precise integrated circuit element comprises applying the negative-working resist composition of the invention to a substrate (for example, a silicon/silicon dioxide film or a transparent substrate, e.g., a glass substrate or an ITO substrate), irradiating the coated layer using an electron beam (under the condition of an accelerating voltage of at least 75 KeV) or X-ray imaging apparatus, heating, developing, rinsing, and drying the coated layer to form a good resist pattern.

A developer for the negative-working resist composition of the invention is ordinarily an aqueous solution of an alkali, for example, an inorganic alkali, e.g., sodium hydroxide, potassium hydroxide, sodium carbonate, sodium silicate, sodium metasilicate or aqueous ammonia; a primary amine, e.g., ethylamine or n-propylamine; a secondary amine, e.g., diethylamine or di-n-butylamine; a tertiary amine, e.g., triethylamine or methyldiethylamine; an alcoholamine, e.g., dimethylethanolamine or triethanolamine; a quaternary ammonium salt, e.g., tetramethylammonium hydroxide, tetraethylammonium hydroxide or choline; and a cyclic amine, e.g., pyrrole or piperidine. Further, an appropriate amount of an alcohol, e.g., isopropyl alcohol or a surface active agent, e.g., a nonionic surface active agent may be added to the aqueous solution of alkali.

Among the developers, a developer containing a quaternary ammonium salt is preferred, and a developer containing tetramethylammonium hydroxide or choline is more preferred.

The present invention is described in more detail with reference to the following examples, but the invention is not limited thereto.

Synthesis Examples of Components
(1) Alkali-soluble Resin
1) Synthesis of Resin (29)

In 30 ml of 1-methoxy-2-propanol were dissolved 3.9 g (0.024 mol) of 4-acetoxystyrene and 0.8 g (0.006 mol) of 4-methoxystyrene, and while stirring the solution under a nitrogen gas stream, 70 ml of a 1-methoxy-2-propanol solution of 50 mg of a polymerization initiator, i.e., 2,2'-azobis(2,4-dimethylvaleronitrile) (V-65, manufactured by Wako Pure Chemical Industries, Ltd.), 9.1 g (0.056 mol) of 4-acetoxystyrene, and 1.9 g (0.014 mol) of 4-methoxystyrene was added dropwise thereto at 70° C. over a period of 2 hours. After 2 hours, 50 mg of the initiator was additionally added thereto and the reaction was further continued for 2 hours. Thereafter, the temperature was raised to 90° C. and the reaction mixture was stirred for one hour. After cooling of the reaction liquid, a white resin was precipitated by pouring the reaction liquid into 1 liter of ion-exchanged water with vigorous stirring. The resulting resin was dried, and then dissolved in 100 ml of methanol, and 25% tetramethylammonium hydroxide was added thereto to hydrolyze the acetoxy group in the resin. Then, the solution was neutralized with an aqueous solution of hydrochloric acid to precipitate a white resin. The resin was washed with ion-exchanged water and dried under reduced pressure to obtain 11.6 g of Resin (29) of the invention. A molecular weight of the resin was measured by GPC, and the weight average molecular weight in terms of polystyrene (Mw) was 9,200 and the degree of dispersion (Mw/Mn) was 2.2.

Other resins (B) of the invention were synthesized in a similar manner.

(2) Acid Generator
1) Synthesis of tetramethylammonium pentafluorobenzenesulfonate In 100 ml of methanol was dissolved 25 g of pentafluorobenzenesulfonyl chloride under cooling with ice, and 100 g of an aqueous solution of 25% tetramethylammonium hydroxide was slowly added thereto. The mixture was stirred for 3 hours at room temperature to obtain a solution of tetramethylammonium pentafluorobenzenesulfonate. The solution was used for salt-exchange with a sulfonium salt or an iodonium salt.

2) Synthesis of triphenylsulfonium pentafluorobenzene sulfonate (I-1)

In 800 ml of benzene was dissolved 50 g of diphenyl sulfoxide, and after the addition of 200 g of aluminum chloride, the mixture was refluxed for 24 hours. The reaction liquid was slowly poured into 2 liters of ice water, and after the addition of 400 ml of concentrated hydrochloric acid, the mixture was heated at 70° C. for 10 minutes. The aqueous solution was washed with 500 ml of ethyl acetate, and after filtration, a solution of 200 g of ammonium iodide dissolved in 400 ml of water was added. The powder thus precipitated was collected by filtration, washed with water and then with ethyl acetate, and dried to obtain 70 g of triphenylsulfonium iodide.

In 1000 ml of methanol was dissolved 30.5 g of triphenylsulfonium iodide, and after the addition of 19.1 g of silver oxide to the solution, the mixture was stirred at room temperature for 4 hours. The solution was filtered and to the filtrate was added an excessive amount of the solution of tetramethylammonium pentafluorobenzenesulfonate described above. The reaction liquid was concentrated, the residue was dissolved in 500 ml of dichloromethane, and the solution was washed with an aqueous solution of 5% tetramethylammonium hydroxide and then with water. The organic phase was dried over anhydrous sodium sulfate, and then, concentrated to obtain triphenylsulfonium pentafluorobenzenesulfonate (I-1).

3) Synthesis of di(4-tert-amylphenyl)iodonium pentafluorobenzenesulfonate (III-1)

Sixty grams of tert-amylbenzene, 39.5 g of potassium iodate, 81 g of acetic anhydride and 170 ml of dichloromethane were mixed, and 66.8 g of concentrated sulfuric acid was slowly added dropwise to the mixture under cooling with ice. After stirring under cooling with ice for 2 hours, the mixture was further stirred at room temperature for 10 hours. To the reaction liquid was added 500 ml of water under cooling with ice, and the resulting mixture was extracted with dichloromethane. The organic phase was washed with sodium hydrogen carbonate and then with water, and concentrated to obtain di(4-tert-amylphenyl) iodonium sulfate. The resulting sulfate was added to an excessive amount of the solution of tetramethylammonium pentafluorobenzenesulfonate described above. To the solution was added 500 ml of water, and the solution was extracted with dichloromethane. The organic phase was washed with an aqueous solution of 5% tetramethylammonium hydroxide and then with water, and concentrated to obtain di(4-tert-amylphenyl)iodonium pentafluorobenzenesulfonate (III-1).

Other acid generator compounds were synthesized similarly.

(3) Crosslinking Agent
1) Synthesis of Intermediate (HM-1)

To an aqueous 10% potassium hydroxide solution was added and dissolved 20 g of 1-[α-methyl-α-(4-hydroxyphenyl)ethyl]-4-[α,α-bis(4-hydroxyphenyl)ethyl]-benzene (Trisp-PA, manufactured by Honshu Chemical Industry Co., Ltd.) with stirring. While stirring the solution, 60 ml of an aqueous 37% formalin solution was gradually added thereto at room temperature over a period of 1 hour. After further stirring at room temperature for 6 hours, the solution was poured into a diluted aqueous sulfuric acid solution. The pecipitates thus formed were collected by filtration, sufficiently washing with water, and recrystallized from 30 ml of methanol to obtain 20 g of a white powder of phenol derivative (Intermediate (HM-1)) containing hydroxymethyl groups having the structure shown below. The purity thereof was 92% (determined by a liquid chromatography method).

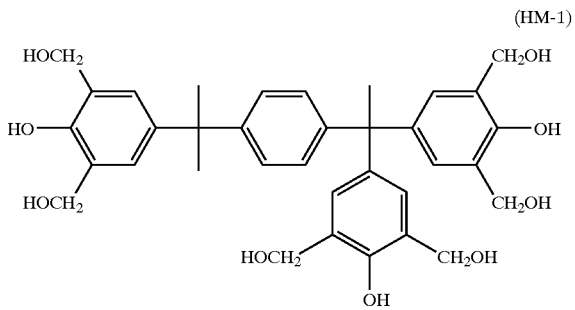

(HM-1)

2) Synthesis of Crosslinking Agent (MM-1)

To one liter of methanol was added and dissolved 20 g of the phenol derivative (Intermediate (HM-1)) having hydroxymethyl groups obtained above with heating and stirring. To the solution was added 1 ml of concentrated sulfuric acid, and the mixture was refluxed for 12 hours.

After the completion of the reaction, the reaction liquid was cooled and 2 g of potassium carbonate was added thereto. After sufficient concentration of the mixture, 300 ml of ethyl acetate was added thereto. The solution was washed with water and concentrated to dryness to obtained 22 g of phenol derivative (Crosslinking Agent (MM-1)) containing methoxymethyl groups having the structure shown below as a white solid. The purity thereof was 90% (determined by a liquid chromatography method).

(MM-1)

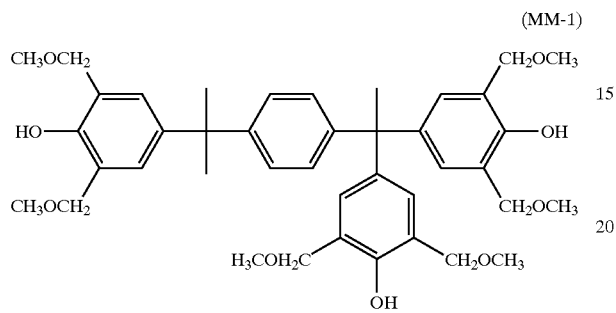

Furthermore, the phenol derivatives shown below were synthesized in a similar manner.

(HM-2)

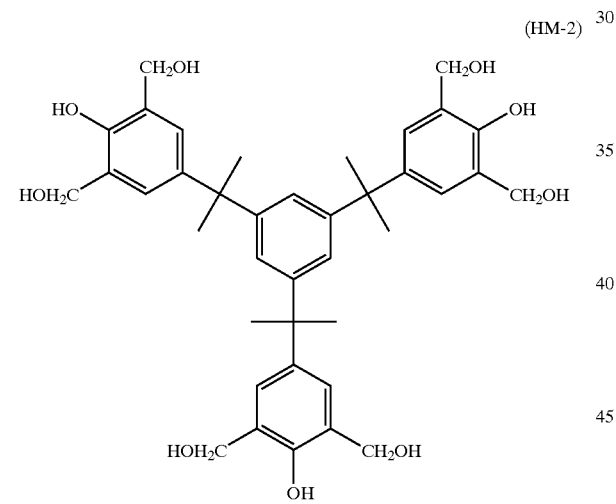

(MM-2)

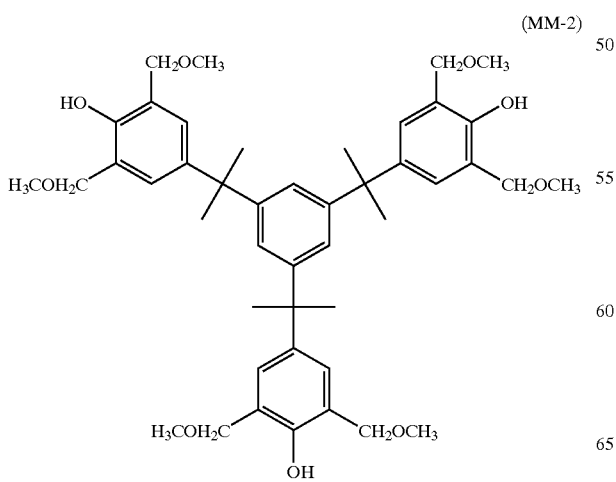

(HM-3)

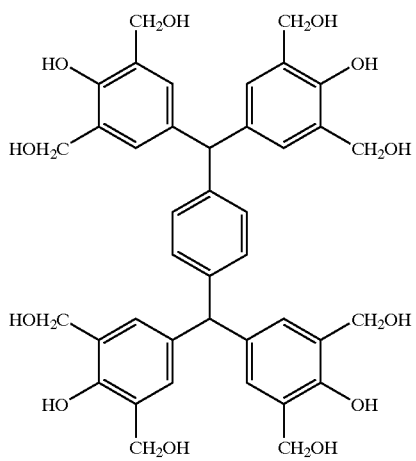

(MM-3)

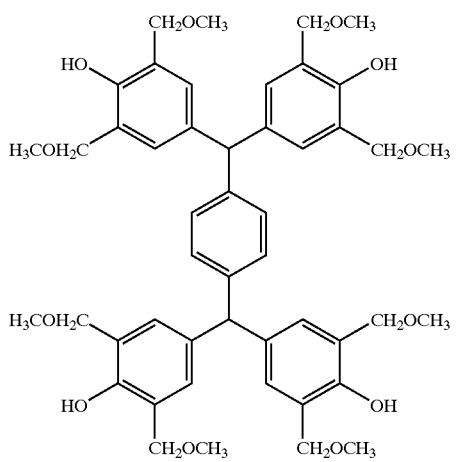

(HM-4)

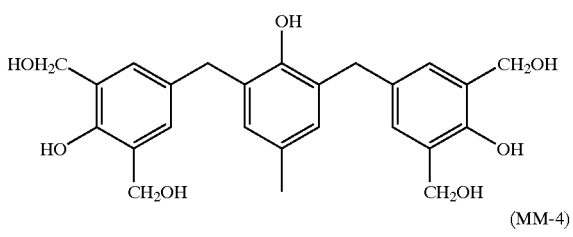

(MM-4)

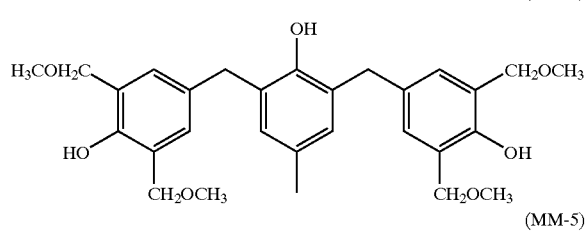

(MM-5)

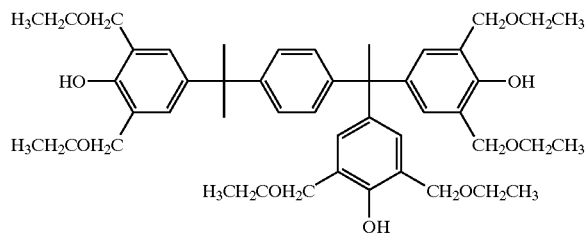

(4) Carboxylic Acid Generator
1) Synthesis of triphenylsulfonium acetate (c-1)

In 800 ml of benzene was dissolved 50 g of diphenyl sulfoxide, and after the addition of 200 g of aluminum chloride, the mixture was refluxed for 24 hours. The reaction liquid was slowly poured into 2 liters of ice water, and after the addition of 400 ml of concentrated hydrochloric acid, the mixture was heated at 70° C. for 10 minutes. The aqueous solution was washed with 500 ml of ethyl acetate, and after filtration, a solution of 200 g of ammonium iodide dissolved in 400 ml of water was added. The powder thus precipitated was collected by filtration, washed with water and then with ethyl acetate, and dried to obtain 70 g of triphenylsulfonium iodide.

In 1000 ml of methanol was dissolved 30.5 g of triphenylsulfonium iodide, and after the addition of 19.1 g of silver oxide to the solution, the mixture was stirred at room temperature for 4 hours. The solution was filtered and an excessive amount of a commercially available ammonium acetate solution was added. The reaction liquid was concentrated, the residue was dissolved in 500 ml of dichloromethane, and the solution was washed with an aqueous solution of 5% tetramethylammonium hydroxide and then with water. The organic phase was dried over anhydrous sodium sulfate, and then concentrated to obtain triphenylsulfonium acetate (c-1).

(4-2) Synthesis of di(4-tert-amylphenyl)iodonium acetate (e-1)

Sixty grams of tert-amylbenzene, 39.5 g of potassium iodate, 81 g of acetic anhydride and 170 ml of dichloromethane were mixed, and 66.8 g of concentrated sulfuric acid was slowly added dropwise to the mixture under cooling with ice. After stirring under cooling with ice for 2 hours, the mixture was stirred at room temperature for 10 hours. To the reaction liquid was added 500 ml of water under cooling with ice, and the resulting mixture was extracted with dichloromethane. The organic phase was washed with sodium hydrogen carbonate and then with water, and concentrated to obtain di(4-tert-amylphenyl)iodonium sulfate. The sulfate was added to an excessive amount of a commercially available ammonium acetate solution. To the solution was added 500 ml of water, and the solution was extracted with dichloromethane. The organic phase was washed with an aqueous solution of 5% tetramethylammonium hydroxide and then with water. The organic phase was dried over anhydrous sodium sulfate and concentrated to obtain di(4-tert-amylphenyl)iodonium acetate (e-1).

Other carboxylic acid generator compounds were synthesized similarly.

EXAMPLES 1 TO 18 AND COMPARATIVE EXAMPLES 1 AND 2

(1) Coating with Resist

Solutions of photoresist compositions having the components shown in Table 1 below were prepared using the compounds according to the invention and comparative compounds.

After the filtration of each solution through a filter of 0.1 μm, the solution was applied to a silicon wafer using a spin coater and dried on a hot plate at 110° C. for 90 seconds to obtain a resist film having a thickness of 0.3 μm.

TABLE 1

| | Resin (B) | Sulfonic Acid Generator (A) | Cross-linking Agent (C) | Carboxylic Acid Generator (D) | Organic Basic Compound (E) | Solvent |
|---|---|---|---|---|---|---|
| Example | | | | | | |
| 1 | (1) Mw = 8000 0.80 g | I-1 0.05 g | MM-1 0.25 g | c-1 0.004 g | OE-1 0.002 g | PGMEA 8.5 g |
| 2 | (2) Mw = 11000 0.80 g | I-5 0.05 g | MM-1 0.25 g | c-2 0.005 g | — | PGMEA 8.5 g |
| 3 | (27) Mw = 7500 x/y = 80/20 0.80 g | I-7 0.05 g | MM-2 0.20 g | c-1 0.005 g | — | PGMEA 8.5 g |
| 4 | (28) Mw = 6000 x/y = 90/10 0.80 g | I-8 0.05 g | MM-3 0.25 g | c-3 0.004 g | OE-1 0.002 g | PGMEA 8.5 g |
| 5 | (25) Mw = 9500 x/y = 60/40 0.80 g | I-7 0.05 g | MM-4 0.25 g | c-1 0.004 g | OE-2 0.002 g | PGMEA 8.5 g |
| 6 | (29) Mw = 18000 x/y = 85/15 0.80 g | I-7 0.05 g | MM-1 0.18 g | c-3 0.004 g | OE-2 0.002 g | PGMEA 8.5 g |
| 7 | (50) Mw = 5600 x/y = 80/20 0.80 g | I-1 0.05 g | MM-1 0.18 g | c-1 0.004 g | OE-1 0.002 g | PGMEA 8.5 g |
| 8 | (15) Mw = 12800 0.80 g | I-8 0.05 g | MM-5 0.20 g | c-4 0.005 g | — | PGMEA 8.5 g |
| 9 | (1) Mw = 15000 0.80 g | I-9 0.05 g | CL-1 0.18 g | c-7 0.006 g | — | PGMEA 8.5 g |
| 10 | (2) Mw = 24000 0.80 g | I-9 0.05 g | CL-2 0.20 g | c-7 0.003 g | OE-3 0.002 g | PGMEA 8.5 g |
| 11 | (93) Mw = 8500 x/y = 80/20 0.80 g | I-1 0.05 g | MM-1 0.25 g | c-8 0.003 g | OE-4 0.003 g | PGMEA 8.5 g |
| 12 | (94) Mw = 7000 x/y = 90/10 0.80 g | I-1 0.05 g | MM-1 0.25 g | c-1 0.003 g | OE-1 0.002 g | PGMEA 8.5 g |
| 13 | (94) Mw = 10500 x/y = 85/15 0.80 g | I-7 0.05 g | MM-2 0.20 g | c-5 0.005 g | — | PGMEA 8.5 g |
| 14 | (96) Mw = 13500 x/y = 70/30 0.80 g | II-1 0.05 g | MM-2 0.20 g | e-1 0.004 g | — | PGMEA 8.5 g |
| 15 | (19) Mw = 5000 0.80 g | II-2 0.05 g | MM-3 0.20 g | e-2 0.003 g | OE-3 0.002 g | PGMEA 8.5 g |
| 16 | (74) Mw = 12000 x/y = 80/20 0.80 g | II-5 0.05 g | MM-4 0.20 g | e-3 0.003 g | OE-1 0.002 g | PGMEA 8.5 g |

TABLE 1-continued

|  | Resin (B) | Sulfonic Acid Generator (A) | Cross-linking Agent (C) | Carboxylic Acid Generator (D) | Organic Basic Compound (E) | Solvent |
|---|---|---|---|---|---|---|
| 17 | (103) Mw = 13100 x/y/z = 50/35/15 0.80 g | I-1 0.05 g | MM-1 0.20 g | d-1 0.005 g | — | PGMEA/ PGME 7.0 g/1.5 g |
| 18 | (106) Mw = 8800 x/y = 95/15 0.80 g | III-1 0.05 g | CL-1 0.20 g | d-2 0.005 g | — | PGMEA/ PGME 5.5 g/3.0 g |
| Comparative Example |  |  |  |  |  |  |
| 1 | (1) Mw = 8000 0.80 g | I-1 0.05 g | MM-1 0.20 g | OH-1 0.004 g | — | PGMEA 8.5 g |
| 2 | (27) Mw = 7500 x/y = 80/20 0.80 g | I-5 0.05 g | MM-1 0.20 g | CC-10 0.004 g | OE-1 0.002 g | PGMEA 8.5 g |

Explanation of the Abbreviations in Table 1;

PGMEA: Propylene glycol monomethyl ether acetate

PGME: Propylene glycol monomethyl ether

Crosslinking Agent CL-1:

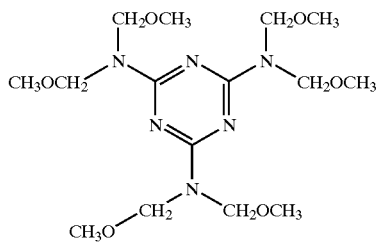

Crosslinking Agent CL-2:

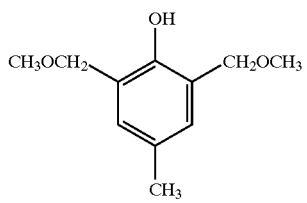

OE-1: 4-Dimethylaminopyridine

OE-2: Benzimidazole

OE-3: 2,4,5-Triphenylimidazole

OE-4: 1,4-Diazabicyclo[5.4.0]undecene

OH-1:

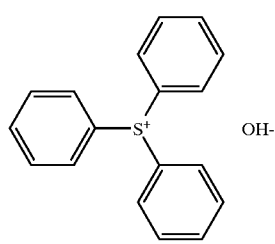

CC-10:

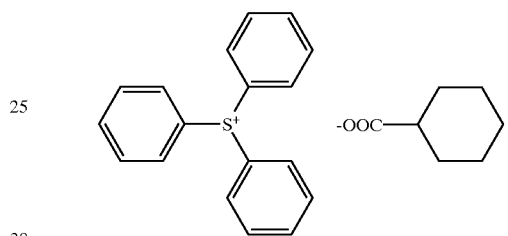

(2) Preparation of Resist Pattern

The resist film was irradiated using an electron beam imaging apparatus (HL750 manufactured by Hitachi, Ltd., acceleration voltage 50 Kev). After the irradiation, the rest film was heated by a hot plate of 110° C. for 60 seconds, dipped in a 2.38% aqueous tetramethylammonium hydroxide (TMAH) solution for 60 seconds, rinsed with water for 30 seconds, and dried. The pattern thus obtained was evaluated according to the following methods.

(2-1) Sensitivity

The cross-sectional form of the pattern obtained was observed by a scanning electron microscope. The sensitivity is determined by using the minimum irradiation energy for resolving a line of 0.20 μm (line:space=1:1).

(2-2) Resolving Power

The resolving power is determined by using the limiting resolving power (line and space being separately resolved) at the irradiation amount sufficient for obtaining the above sensitivity.

(2-3) Reproducibility of Beam Shape

The reproducibility of beam shape was determined by observing a curvature radius of a 90° crooked part of the pattern obtained (pattern size=0.20 μm) from the top of the wafer using a scanning electron microscope.

The evaluation results are shown in Table 2.

TABLE 2

|  | Sensitivity ($\mu C/cm^2$) | Resolving Power ($\mu m$) | Reproducibility of Beam Shape ($\mu m$) |
|---|---|---|---|
| Example 1 | 10 | 0.09 | 0.07 |
| Example 2 | 8 | 0.10 | 0.06 |
| Example 3 | 7 | 0.08 | 0.08 |
| Example 4 | 11 | 0.08 | 0.05 |
| Example 5 | 9 | 0.08 | 0.05 |

TABLE 2-continued

| | Sensitivity ($\mu C/cm^2$) | Resolving Power ($\mu m$) | Reproducibility of Beam Shape ($\mu m$) |
|---|---|---|---|
| Example 6 | 10 | 0.10 | 0.10 |
| Example 7 | 9 | 0.09 | 0.08 |
| Example 8 | 7 | 0.08 | 0.15 |
| Example 9 | 6 | 0.09 | 0.10 |
| Example 10 | 9 | 0.10 | 0.06 |
| Example 11 | 10 | 0.11 | 0.05 |
| Example 12 | 12 | 0.10 | 0.06 |
| Example 13 | 9 | 0.08 | 0.08 |
| Example 14 | 7 | 0.09 | 0.10 |
| Example 15 | 10 | 0.11 | 0.07 |
| Example 16 | 8 | 0.08 | 0.07 |
| Example 17 | 7 | 0.10 | 0.12 |
| Example 18 | 11 | 0.10 | 0.08 |
| Comparative Example 1 | 15 | 0.11 | 0.50 |
| Comparative Example 2 | 11 | 0.14 | 0.40 |

From the results in Table 2, it can be seen that the negative-working resist compositions of the invention containing the compound (D) generating a carboxylic acid having a specific structure by the irradiation of electron beams or X-rays are excellent in both the sensitivity and the resolving power and exhibit the remarkably improved reproducibility of beam shape as compared with the comparative examples containing the compound generating OH⁻ by the irradiation of electron beams or X-rays or the compound generating a carboxylic acid having a structure different from the carboxylic acid generated from the compound (D) of the invention by the irradiation of electron beams or X-rays.

According to the invention, a negative-working resist composition for electron beams and X-rays excellent in the sensitivity, the resolving power and the reproducibility of beam shape even under highly accelerated voltage conditions can be provided.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and score thereof.

What is claimed is:

1. A negative-working resist composition for electron beams or X-rays comprising (A) a compound generating a sulfomc acid by the irradiation of electron beams or x-rays, (B) a resin which is insoluble in water and soluble in an alkali aqueous solution, (C) a crosslinking agent containing at least three benzene rings and crosslinking with the resin (B) by the action of an acid, and (D) a compound generating, by the irradiation of electron beams or x-rays, a carboxylic acid represented by the following formula (a):

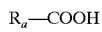
(a)

wherein $R_a$ represents an alkyl group having 1 to 4 carbon atoms or a perfluoroalkyl group having 1 to 8 carbon atoms, wherein the resin (B) is a resin having a repeating unit represented by the following formula (b):

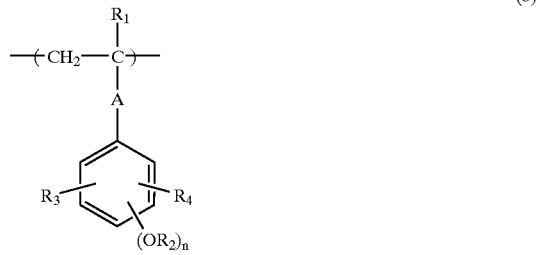
(b)

wherein $R_1$ represents a hydrogen atom, a halogen atom, a cyano group, or an alkyl or haloalkyl group which may have a substituent; $R_2$ represents a hydrogen atom, or an alkyl, cycloalkyl, aryl, aralkyl or acyl group which may have a substituent; $R_3$ and $R_4$, which may be the same or different, each represents a hydrogen atom, a halogen atom, a cyano group, or an alkyl, cycloalkyl, alkenyl, aralkyl or aryl group which may have a substituent; A represents a single bond, an alkylene, alkenylene, cycloalkylene or arylene group which may have a substituent, —O—, —SO₂—, —O—CO—R₅, —CO—O—R₆—, or —CO—N(R₇)—R₈—; R₅, R₆ and R₈, which may be the same or different, each represents a single bond, an alkylene, alkenylene, cycloalkylene or arylene group, which may have a substituent, or a divalent group formed by combining the above-described alkylene, alkenylene, cycloalkylene or arylene group and at least one member selected from an ether structure, an ester structure, an amino structure, a urethane structure and a ureido structure; R₇ represents a hydrogen atom, or an alkyl, cycloalkyl, aralkyl or aryl group which may have a substituent; and n renresents an integer of 1 to 3; or plural R₂'s, or R₂ and R₃ or R₄ may combine with each other to form a ring.

2. The negative-working resist composition for electron beams or X-rays according to claim 1, wherein the resist composition further comprises (E) a nitrogen-containing organic basic compound.

3. The negative-working resist composition for electron beams or X-rays according to claim 1, wherein the resin (B) is a resin having at least one repeating unit selected from those represented by the following formulae (b-2) and (b-3):

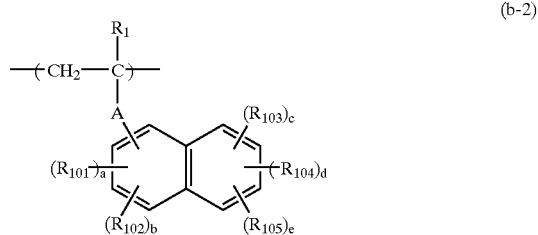
(b-2)

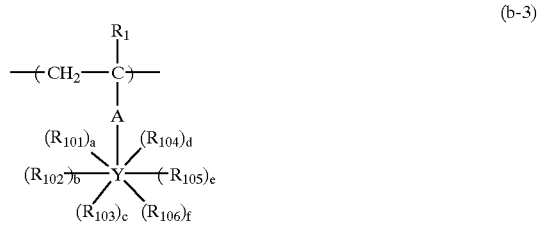
(b-3)

wherein $R_1$ and A have the same meanings as $R_1$ and A in formula (b), respectively; $R_{101}$ to $R_{106}$ each independently represents a hydroxyl group, a linear, branched or cyclic alkyl group, an alkoxy group, an alkylcarbonyloxy group, an alkylsulfonyloxy group, an alkenyl group, an aryl group, an aralkyl group, a carboxyl group, an amino group, an N-alkylamino group, or an N-dialkylamino group; a to f each independently represents an integer of 0 to 3; and Y represents a condensed polycyclic aromatic structure selected from those described below:

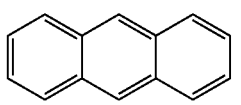 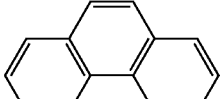

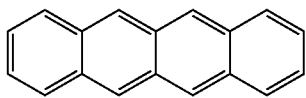

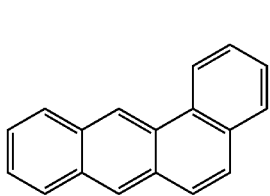 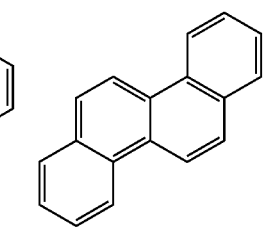

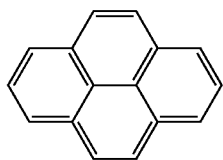 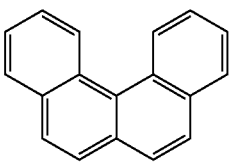 and

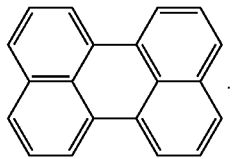

4. The negative-working resist composition for electron beams or X-rays according to claim 1, wherein the compound (A) is a sulfonium salt or iodinium salt represented by the following formula (I), (II) or (III):

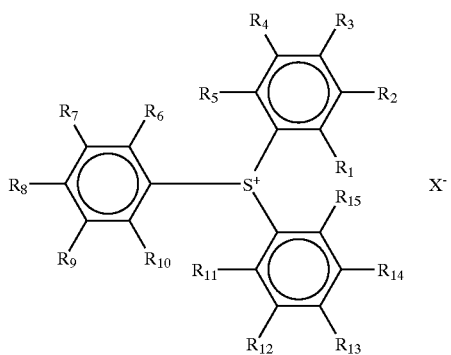

(I)

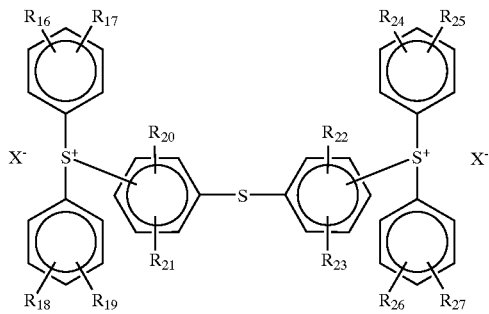

(II)

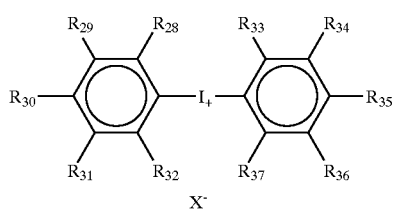

(III)

wherein $R_1$ to $R_{37}$ each represents a hydrogen atom, an alkyl group, an alkoxy group, a hydroxyl group, a halogen atom or $-S-R_{38}$; $R_{38}$ represents an alkyl group or an aryl group; and X— represents an anion of sulfonic acid.

5. The negative-working resist composition for electron beams or X-rays according to claim 1, wherein the acid crosslinking agent (C) is a compound selected from alkoxymethylated or acyloxymethylated melamine compounds or resins, alkoxymethylated or acyloxymethylated urea compounds or resins, hydroxymethylated or alkoxymethylated phenol compounds or resins, and alkoxymethyl etherified phenol compounds or resins.

6. The negative-working resist composition for electron beams or X-rays according to claim 2, wherein the nitrogen-containing organic basic compound is a compound containing a structure represented by the following formula (A), (B), (C), (D) or (E):

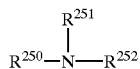

(A)

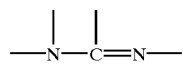

(B)

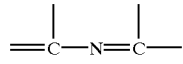

(C)

(D)

(E)

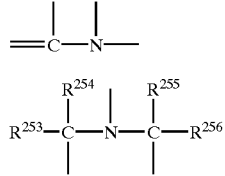

wherein $R^{250}$, $R^{251}$ and $R^{252}$, which may be the same or different, each renresents a hydrogen atom, an alkyl group having 1 to 6 carbon atoms, an aminoalkyl group having 1 to 6 carbon atoms, a hydroxyalkyl group having 1 to 6 carbon atoms or a substituted or unsubstituted aryl group having 6 to 20 carbon atoms, or $R^{251}$, and $R^{252}$ may combine with each other to form a ring, and $R^{253}$, $R^{254}$, $R^{255}$ and $R^{256}$, which may be the same or different, each represents an alkyl group having 1 to 6 carbon atoms.

7. The negative-working resist composition for electron beams or X-rays according to claim 1, wherein the resist composition further comprises a solvent.

\* \* \* \* \*